(12) United States Patent
Park et al.

(10) Patent No.: US 11,966,608 B2
(45) Date of Patent: Apr. 23, 2024

(54) MEMORY CONTROLLER WITH IMPROVED DATA RELIABILITY AND MEMORY SYSTEM INCLUDING THE SAME

(71) Applicant: SAMSUNG ELECTRONICS CO., LTD., Suwon-si (KR)

(72) Inventors: Dohyeon Park, Seoul (KR); Dongeun Shin, Seoul (KR); Wansoo Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 38 days.

(21) Appl. No.: 17/895,318

(22) Filed: Aug. 25, 2022

(65) Prior Publication Data

US 2023/0176759 A1    Jun. 8, 2023

(30) Foreign Application Priority Data

Nov. 15, 2021 (KR) .................. 10-2021-0157080
Feb. 23, 2022 (KR) .................. 10-2022-0023832

(51) Int. Cl.
*G06F 12/00* (2006.01)
*G06F 3/06* (2006.01)

(52) U.S. Cl.
CPC ............ *G06F 3/064* (2013.01); *G06F 3/0617* (2013.01); *G06F 3/0619* (2013.01); *G06F 3/065* (2013.01); *G06F 3/0689* (2013.01)

(58) Field of Classification Search
CPC ...... G06F 3/064; G06F 3/0617; G06F 3/0619; G06F 3/065; G06F 3/0689; G06F 2212/7201; G06F 11/108; G06F 12/0246; G06F 11/1048; G06F 11/1076; G11C 2029/0403; G11C 2029/1202; G11C 16/08; G11C 16/3418; G11C 29/025; (Continued)

(56) References Cited

U.S. PATENT DOCUMENTS 5,596,709 A * 1/1997 Bond .................. G06F 11/1084
                                              714/6.32
7,890,550 B2   2/2011 Jung et al.
(Continued)

FOREIGN PATENT DOCUMENTS

KR       100789406        12/2007

OTHER PUBLICATIONS

European Search Report dated Apr. 5, 2023, Cited in Corresponding EP Patent Application No. 22195533.9.

*Primary Examiner* — Mardochee Chery
(74) *Attorney, Agent, or Firm* — Fish & Richardson P.C.

(57) ABSTRACT

A memory controller with improved data reliability and a memory system including the same are provided, and an operating method of the memory controller includes, based on deterioration information indicating a location of a deterioration region in the plurality of blocks, with respect to data stored in a first block, copying user data of a RAID to a normal region other than the deterioration region of a second block; copying parity data of the RAID among the data stored in the first block to the deterioration region of the second block; and updating mapping information between data constituting one RAID and transmitting the mapping information to the memory device. The deterioration information includes information regarding one or more word lines at specific locations included in the deterioration region in the plurality of blocks.

20 Claims, 17 Drawing Sheets

(58) Field of Classification Search
CPC ............. G11C 29/42; G11C 16/0483; G11C 2207/2236; G11C 16/349; G11C 29/04; G11C 29/4401; G11C 29/74
USPC .......................................................... 711/158
See application file for complete search history.

(56) References Cited

U.S. PATENT DOCUMENTS

| | | | |
|---|---|---|---|
| 8,589,766 B2 | 11/2013 | Post et al. | |
| 8,656,252 B2 | 2/2014 | So et al. | |
| 8,788,908 B2 | 7/2014 | Yoon et al. | |
| 9,213,609 B2 * | 12/2015 | Hansen | G06F 11/2097 |
| 9,558,847 B2 | 1/2017 | Tuers et al. | |
| 9,891,826 B1 | 2/2018 | Um et al. | |
| 9,928,126 B1 * | 3/2018 | Shappir | G11C 11/5642 |
| 10,157,099 B2 | 12/2018 | Ou et al. | |
| 2011/0066882 A1 | 3/2011 | Walls et al. | |
| 2012/0246443 A1 | 9/2012 | Meir et al. | |
| 2013/0290777 A1 * | 10/2013 | Yoshihara | G06F 11/1068 714/15 |
| 2016/0055917 A1 | 2/2016 | Lee | |
| 2016/0179422 A1 | 6/2016 | Lee | |
| 2018/0196622 A1 * | 7/2018 | Oshimi | G06F 11/3037 |
| 2018/0239671 A1 | 8/2018 | Wei et al. | |

* cited by examiner

MEMORY CONTROLLER WITH IMPROVED DATA RELIABILITY AND MEMORY SYSTEM INCLUDING THE SAME

CROSS-REFERENCE TO RELATED APPLICATIONS

A claim of priority under 35 U.S.C. § 119 is made to Korean Patent Application No. 10-2021-0157080, filed on Nov. 15, 2021, and Korean Patent Application No. 10-2022-0023832, filed on Feb. 23, 2022, in the Korean Intellectual Property Office, the entirety of which are hereby incorporated by reference.

BACKGROUND

The present disclosure relates to memory controllers, and more particularly to memory controllers having improved data reliability and memory systems including the same.

Flash memory is a type of nonvolatile memory that may retain stored data even when power thereto is interrupted. Memory systems such as solid state drive (SSD) and memory cards typically use flash memory systems (or storage devices) including flash memory, and are useful for storing or moving a large amount of data.

A flash memory device may include a plurality of blocks, and each block may include a plurality of word lines. In the structure of the flash memory device, there may be regions (e.g., deterioration regions) having relatively low data storage characteristics, and memory cells connected to word lines at specific locations in such deterioration regions have characteristics lower than those of memory cells connected to word lines at other locations not within the deterioration regions. In addition, in order to increase data reliability, an error correction/repair technique (e.g., a redundant array of inexpensive disks (RAID), etc.) using parities may be applied to improve data reliability of flash memory devices. However, as the degree of integration of flash memory devices increases, the degree of deterioration may also increase, and management is thus required to secure reliability responsive to deterioration.

SUMMARY

The present disclosure provides a memory controller with improved data reliability in response to a deterioration region in a flash memory device, and a memory system including the memory controller.

Embodiments of the inventive concepts provide an operating method of a memory controller for controlling a memory device including a plurality of blocks, the operating method including copying user data stored in a first block from among the plurality of blocks of a redundant array of inexpensive disks (RAID) to a normal region other than a deterioration region of another block from among the plurality of blocks, based on deterioration information indicating a location of the deterioration region in the plurality of blocks; copying parity data of the RAID among the data stored in the first block to the deterioration region of the another block; and updating mapping information between data constituting the RAID and transmitting the mapping information to the memory device. The deterioration information includes information regarding one or more word lines at specific locations included in the deterioration region in the plurality of blocks.

Embodiments of the inventive concepts further provide a memory controller for controlling a memory device including a plurality of blocks, the memory controller including a processor; a working memory storing a flash translation layer executed by the processor; and a memory interface configured to communicate with the memory device. During a background operation of the memory device with respect to a plurality of pieces of user data and parity data corresponding to the plurality of pieces of user data, the plurality of pieces of user data and the parity data being stored in the memory device and constituting a redundant array of inexpensive disks (RAID), the memory interface is configured responsive to the processor to output a first address so that the plurality of pieces of user data are copied to a normal region of the plurality of blocks, and a second address so that the parity data is copied to a deterioration region of the plurality of blocks.

Embodiments of the inventive concepts still further provide a memory system including a memory device, wherein the memory device includes a memory cell array including a plurality of blocks; a control logic circuit configured to control operations of writing and reading data to and from the memory cell array; and an interface circuit configured to transmit and receive various signals to and from a memory controller. The interface circuit is configured to output to the memory controller deterioration information including information regarding one or more word lines at specific locations included in a deterioration region of the plurality of blocks. A plurality of pieces of user data and parity data corresponding to the plurality of pieces of user data are stored in the memory device and constitute a redundant array of inexpensive disks (RAID). The control logic circuit is configured to copy the plurality of pieces of user data to a normal region of the plurality of blocks, and copy the parity data to the deterioration region of the plurality of blocks based on the various signals from the memory controller.

Embodiments of the inventive concepts also provide a memory controller for controlling a memory device, the memory controller including a processor; and a working memory storing a flash translation layer (FTL) executed by the processor. During a background operation of the memory device the processor is configured to receive from the memory device deterioration information indicating a location of a deterioration region in blocks from among a plurality of blocks of the memory device, generate a first copy address for copying a first type of data having a relatively high access frequency to a normal region from among the plurality of blocks and generate a second copy address for copying a second type of data having relatively low access frequency to the deterioration region based on the deterioration information, and transmit the first and second copy addresses to the memory device.

BRIEF DESCRIPTION OF THE DRAWINGS

Embodiments of the inventive concept will be more clearly understood from the following detailed description taken in conjunction with the accompanying drawings in which like reference characteristics refer to like parts throughout and in which.

DETAILED DESCRIPTION OF THE EMBODIMENTS

Hereinafter, embodiments will be described in detail with reference to the accompanying drawings. As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
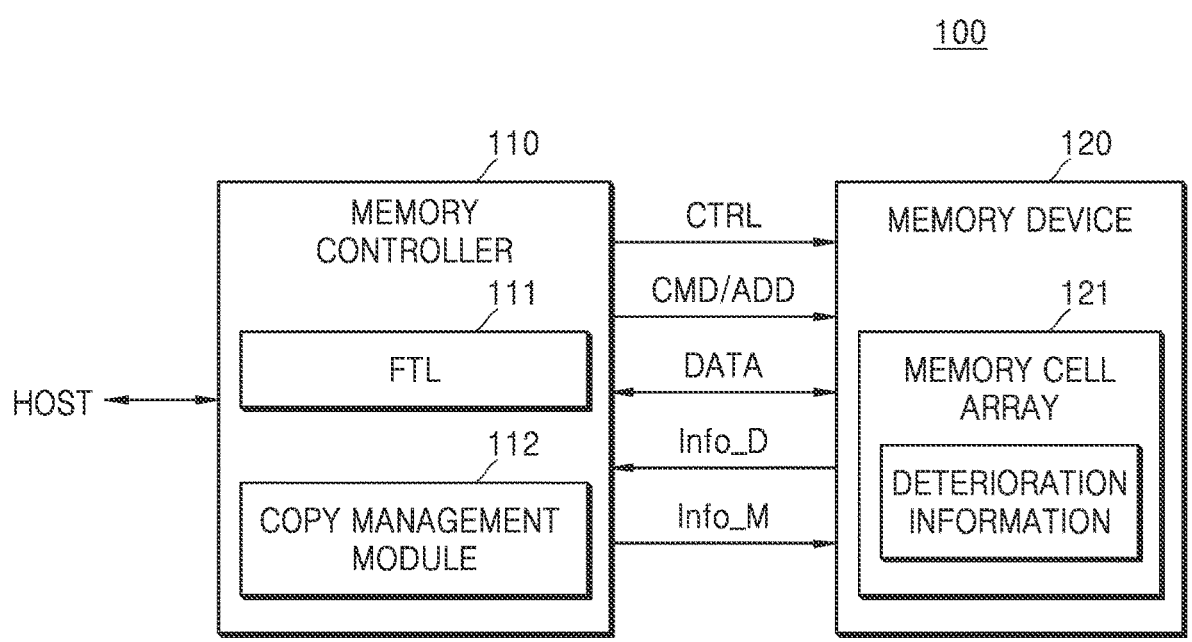
FIG. 1 illustrates a block diagram of a memory system according to embodiments of the inventive concepts.

FIG. 1 illustrates a block diagram of a memory system 100 according to embodiments of the inventive concepts.

Referring to FIG. 1, the memory system 100 may include a memory controller 110 and a memory device 120, and the memory device 120 may include a memory cell array 121. Though not shown in FIG. 1, the memory device 120 may include various peripheral circuits for controlling write/read/erase operations performed on memory cells included in the memory cell array 121. For example, the memory device 120 may further include a row decoder, a voltage generator, and a control logic circuit among other circuits (not shown).

For example, the memory system 100 may communicate with a host HOST through various interfaces. As an example, the memory system 100 may communicate with the host HOST through various interfaces, such as a universal serial bus (USB) interface, a Multi-Media Card™ (MMC) interface, an embedded MMC (eMMC®) interface, a peripheral component interconnect (PCI) interface, a PCI-express (PCI-E) interface, an advanced technology attachment (ATA) interface, a serial-ATA interface, a parallel-ATA interface, a small computer small interface (SCSI) interface, an enhanced small disk interface (ESDI) interface, an integrated drive electronics (IDE) interface, a Firewire interface, a universal flash storage (UFS) interface, and a nonvolatile memory express (NVMe) interface.

According to example embodiments, the memory device 120 may include a nonvolatile memory device, such as a flash memory device. In some embodiments, the memory system 100 may be implemented as an embedded or removable memory in an electronic device. For example, the memory system 100 may be implemented in various forms, such as an embedded UFS memory device, an eMMC®, a solid state drive (SSD), a UFS memory card, a Compact Flash® card (CF) card, a Secure Digital (SD®) card, a micro-SD card, mini-SD, an extreme digital (xD) card, or a Memory Stick™ (MS). Also, the memory system 100 stores data in a non-volatile manner and thus may be referred to as a storage device.

In addition, according to example embodiments, the memory device 120 may include a plurality of flash memory chips. The memory controller 110 may communicate with the memory device 120 through one or more channels. Accordingly, the memory cell array 121 may include a memory cell array included in one or more flash memory chips.

The memory controller 110 may control the memory device 120 to read data stored in the memory device 120 or to write data to the memory device 120, in response to a write/read request from the host HOST. For example, the memory controller 110 may control write, read, and erase operations of the memory device 120 by providing a command/address CMD/ADD and a control signal CTRL to the memory device 120. Also, data DATA to be stored in the memory device 120 and data DATA to be read from the memory device 120 may be transmitted/received between the memory controller 110 and the memory device 120.

The memory cell array 121 may include a plurality of memory cells, and the plurality of memory cells may be, for example, flash memory cells. Hereinafter, embodiments of the inventive concepts are described with reference to a case in which the plurality of memory cells are NAND flash memory cells. However, the inventive concepts are not limited thereto. For example, in some embodiments the plurality of memory cells may be resistive memory cells, such as resistive random-access memory (RAM) (ReRAM) memory cells, phase change RAM (PRAM) memory cells, or magnetic RAM (MRAM) memory cells.

The memory cell array 121 may include a plurality of blocks, each block may include a plurality of cell strings, and each cell string may be connected to a plurality of word lines. Also, a plurality of memory cells may be connected to each word line, and each memory cell may store one or more data bits. In the flash memory device, when a data write/read unit is defined as a page, memory cells connected to each word line may constitute one or more pages, and the block may be defined as a data erase unit. Hereinafter, in descriptions of a deterioration region of the memory cell array 121 in the embodiments of the inventive concepts, the deterioration region may be defined as including memory cells connected to one or more word lines having relatively low data storage characteristics. Alternatively, for convenience of descriptions, one or more word lines may be referred to as constituting a deterioration region.

According to embodiments of the inventive concepts, the memory controller 110 may include a flash translation layer (FTL) 111 and a copy management module 112. The FTL 111 may include software (or firmware) that manages write, read, and erase operations of the flash memory device and may be loaded into an operation memory (not shown) in the memory controller 110. The software included in the FTL 111 may be executed by a processor (not shown) included in the memory controller 110.

The memory controller 110 may control various operations of the memory device 120, based on execution by the FTL 111. For example, the memory controller 110 may convert a logical address from the host HOST into a physical address and provide the same to the memory device 120, upon a data access request from the host HOST. Also, the FTL 111 may perform a management operation for various cell regions (e.g., a chip unit, a block unit, and a page unit) included in the memory cell array 121, and may, for example, perform a background operation, such as a reclaim operation and a garbage collection operation, on a plurality of blocks of the memory cell array 121 provided in the memory device 120.

The background operation may include an operation of copying data stored in one block to one or more other blocks (e.g., another block). For example, the reclaim operation may include an operation of copying, when there is a possibility of data loss as a specific block deteriorates, data (e.g., valid data and invalid data) stored in the specific block to one or more other blocks. Also, the garbage collection operation may include an operation of copying valid data stored in two or more source blocks to one or more destination blocks. According to embodiments of the inventive concepts, the copy management module 112 may manage a data copy in the background operation, such as the reclaim operation and/or the garbage collection operation, and as an example, the copy management module 112 may generate an address (e.g., a copy address) indicating a data copy location.

Detailed descriptions of operations in example embodiments of the inventive concepts are as follows.

Each cell string included in the memory cell array 121 may include a plurality of memory cells, and the plurality of memory cells in each cell string may be arranged in series between one or more string select transistors and one or more ground select transistors. The string select transistor(s) may be connected to a bit line, the ground select transistor(s) may be connected to a common source line, and when the blocks of the memory cell array 121 have a three-dimensional structure (or a vertical structure), the cell strings may be implemented to extend in a direction perpendicular to a semiconductor substrate (not shown). Accordingly, each cell string may include a plurality of memory cells vertically located with respect to the semiconductor substrate.

When one block is used as an example, each of the word lines may be commonly connected to a plurality of cell strings included in the block, and depending on the structure of the memory cell array 121, the deterioration region may include one or more word lines (or memory cells connected to the one or more word lines). The deterioration region may be generated by various causes, and as an example, some word lines may be included in the deterioration region due to various causes such as structural or driving method of the memory device 120.

In each block of the memory cell array 121, the deterioration region may include word lines at specific locations among a plurality of word lines. For example, assuming that memory cells of a cell string are vertically arranged on the semiconductor substrate, one or more word lines adjacent to the semiconductor substrate (or adjacent to the ground select transistor) may be included in the deterioration region. Because memory cells included in the deterioration region are more sensitive to read disturbance than memory cells connected to word lines in a normal region, the possibility of errors occurring during a read operation may be relatively high, and the possibility of loss of data stored in the deterioration region may be relatively high, and thus, reliability of data stored in the deterioration region may be relatively poor.

According to embodiments of the inventive concepts, the memory system 100 may store deterioration information Info_D indicative of the deterioration region of the memory cell array 121. For example, during a manufacturing process of the memory device 120, the memory cell array 121 may be tested, and deterioration information Info_D as a result of the test may be stored in the memory system 100 in a non-volatile manner. In the embodiment shown in FIG. 1, an example is illustrated in which the deterioration information Info_D is stored in some regions of the memory cell array 121, but the embodiments of the inventive concepts are not necessarily limited thereto. For example, the deterioration information Info_D may be received by the memory controller 110 from the memory device 120. For example, the deterioration information Info_D may be stored in a storage circuit in the memory controller 110 in a non-volatile manner and used for a copy location calculation operation, or may be stored in a storage circuit external to the memory cell array 121 of the memory device 120.

According to embodiments of the inventive concepts, the deterioration information Info_D may include information regarding one or more word lines at specific locations in each block, and as an example, the deterioration information Info_D may include address information regarding one or more word lines that are sensitive to read disturbance because the word lines are located relatively close to a substrate. Alternatively, the degree of errors occurring in each word line may be monitored according to test results for word lines of each block, and the deterioration information Info_D may include address information regarding one or more word lines having a relatively high frequency of errors occurring. The frequency of errors may be compared to a threshold to determine word lines having relatively high frequency of errors.

As a management operation for the memory device 120, the memory controller 110 may control a data copy operation in the reclaim operation and the garbage collection operation. According to an example embodiment, the memory controller 110 may determine a type of data stored in the memory device 120 and control a data copy operation based on the determined type of data. Data may be classified into a plurality of types based on various criteria, and a copy operation may be controlled so that a specific type of data is copied to the normal region and another type of data is copied to the deterioration region. For example, data having a relatively high frequency of access by the host HOST may be classified as first type data, and data having a relatively low access frequency may be classified as second type data. The first type data may be copied to the normal region, and the second type data may be copied to the deterioration region.

When a frequency of access, such as writing/reading of data, is high, the degree of deterioration of the memory cells storing data may increase, and accordingly, when access to data stored in word lines that are relatively sensitive to read disturbance increases, the possibility of data loss may further increase. However, according to the embodiments of the inventive concepts, the possibility of data loss due to read disturbance may be reduced by classifying types of data based on an access frequency and copying data having a relatively low access frequency to the deterioration region.

In a data error correction/repair process, for data of a preset unit, an error thereof may be repaired by using at least one piece of parity data. For example, when a redundant array of inexpensive disks (RAID) is used as an example, one or more pieces of data stored in different locations (hereinafter, referred to as user data) and parity data may constitute a RAID. In this case, the user data may have a relatively high access frequency upon a request from the host HOST, whereas the parity data may have a relatively low access frequency. According to an example of the inventive concept, the user data may be classified as the first type data, and the parity data may be classified as the second type data. The user data may be copied to the normal region, and the parity data may be copied to the deterioration region.

The copy management module 112 may generate a copy address so that the first type data having a relatively high access frequency is copied to the normal region, whereas the second type data having a relatively low access frequency is copied to the deterioration region. For example, the copy management module 112 may generate a first copy address so that a first type data having a relatively high access frequency is copied to the normal region, and may generate a second copy address so that a second type data having a relatively low access frequency is copied to the deterioration region.

In addition, the user data and the parity data constituting the RAID may be stored in specific locations (e.g., word lines at the same location) of blocks of one or more memory chips, and accordingly, the user data and the parity data constituting the RAID may be read without using separate address information. According to the embodiments of the inventive concepts, locations in which the user data and the parity data constituting the RAID are stored within a block may be changed based on a copy operation, and thus, according to the embodiments of the inventive concepts, mapping information between the user data and the parity data constituting the RAID may be generated and managed, and the mapping information may also be updated after the copy operation is performed. The memory controller 110 may generate mapping information Info_M and provide the same to the memory device 120.

Moreover, the function of the copy management module 112 in the embodiments described above may be implemented by a hardware circuit or software, or may be implemented based on a combination of hardware and software. For example, when the copy management module 112 is implemented by hardware, a copy address indicating a location to which data is copied may be generated based on the deterioration information Info_D through a certain operation. Alternatively, when the copy management module 112 is implemented by software, software performing the function of the copy management module 112 may be stored in the memory controller 110, and as an example, the software performing the function of the copy management module 112 may be included in the FTL 111.

Figure 2:
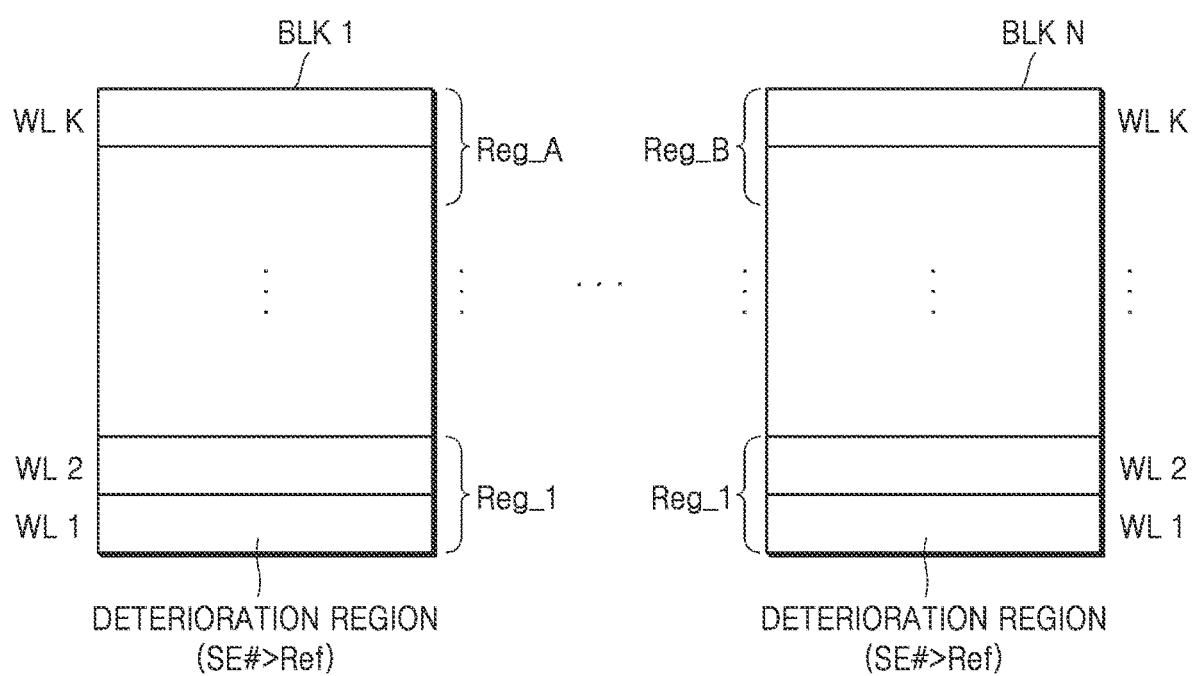
FIG. 2 illustrates a block diagram of an example of setting a deterioration region in a memory cell array.

FIG. 2 illustrates a block diagram of an example of setting a deterioration region in the memory cell array 121. FIG. 2 illustrates a case in which the memory cell array 121 includes a first block BLK 1 to an N-th block BLK N, and each block includes a first word line WL 1 to a K-th word line WL K, and the first to N-th blocks BLK 1 to BLK N may be blocks included in one or more flash memory chips.

Referring to FIG. 2, according to an example embodiment of the inventive concepts, the deterioration region may be set in various units, and as an example, one or more word lines included in one block may be set as the deterioration region. Also, each block may be classified into a plurality of regions, and a plurality of deterioration regions may be included in a block according to the degree of sensitivity to read disturbance. FIG. 2 illustrates a case in which the first block BLK 1 is classified into A regions according to the degree of read disturbance, and the N-th block BLK N is classified into B regions according to the degree of read disturbance, and in the first block BLK 1, a first region Reg_1 may correspond to a region having the highest sensitivity to read disturbance, and an A-th region Reg_A may correspond to a region having the lowest sensitivity to read disturbance. Also, in the N-th block BLK N, a first region Reg_1 may correspond to a region having the highest sensitivity to read disturbance, and a B-th region Reg_B may correspond to a region having the lowest sensitivity to read disturbance.

According to embodiments of the inventive concepts, the deterioration region may be defined based on various criteria. For example, one or more regions including the first region Reg_1 among A regions of the first block BLK 1 and thus having a relatively high sensitivity to read disturbance may be defined as a deterioration region. Similarly, one or more regions including the first region Reg_1 among B regions of the N-th block BLK N and thus having a relatively high sensitivity to read disturbance may be defined as a deterioration region. That is, according to embodiments of the inventive concepts, when each block is classified into a plurality of regions, regions included in a deterioration region may be defined based on various criteria (e.g., a height of a word line, a bit error rate, etc.).

Referring to FIG. 2, assuming that the first region Reg_1 in each block is a deterioration region, in a case where the block is implemented as a three-dimensional memory cell array, word lines located at a relatively lower portion (or adjacent to the semiconductor substrate) may be defined as a deterioration region. For example, a preset number of word lines in each block may be defined as a deterioration region, and FIG. 2 illustrates a case in which a first word line WL1 and a second word line WL2 are defined as a deterioration region.

According to an example embodiment, the deterioration region may be determined during a test process for a memory device. For example, during a manufacturing process of the memory device, through a test operation on a plurality of word lines of the memory device, the degree of errors occurring may be determined based on a threshold voltage distribution characteristic for each word line. One or more word lines having a relatively poor threshold voltage distribution characteristic and thus having a high frequency of errors occurring may be determined to be a deterioration region, and deterioration information indicating locations of the word lines may be stored in the memory device. As an example, the degree of shift in a threshold voltage distribution may be determined by using a plurality of read voltages (e.g., a hard decision voltage and a soft decision voltage) for the same memory cells, and memory cells in which a threshold voltage level is relatively largely shifted may be determined to have a strong error.

According to an example embodiment of the inventive concepts, the deterioration region may be determined based on the number of strong errors SE# that occurred in each word line. For example, the number of strong errors SE# that occurred in each word line may be compared with a preset reference value Ref, and a word line in which the number of strong errors SE# exceeds the reference value Ref may be defined as a deterioration region. For example, FIG. 2 illustrates a case in which some lower word lines are defined as a deterioration region. However, when the deterioration region is defined according to an error characteristic (or a threshold voltage distribution characteristic) of each word line, a word line at an arbitrary location in each block may be defined as a deterioration region. Also, the number of strong errors SE# may be compared with a plurality of reference values, and a plurality of deterioration regions having different degrees of deterioration in each block may be defined based on the comparison.

Figure 3:
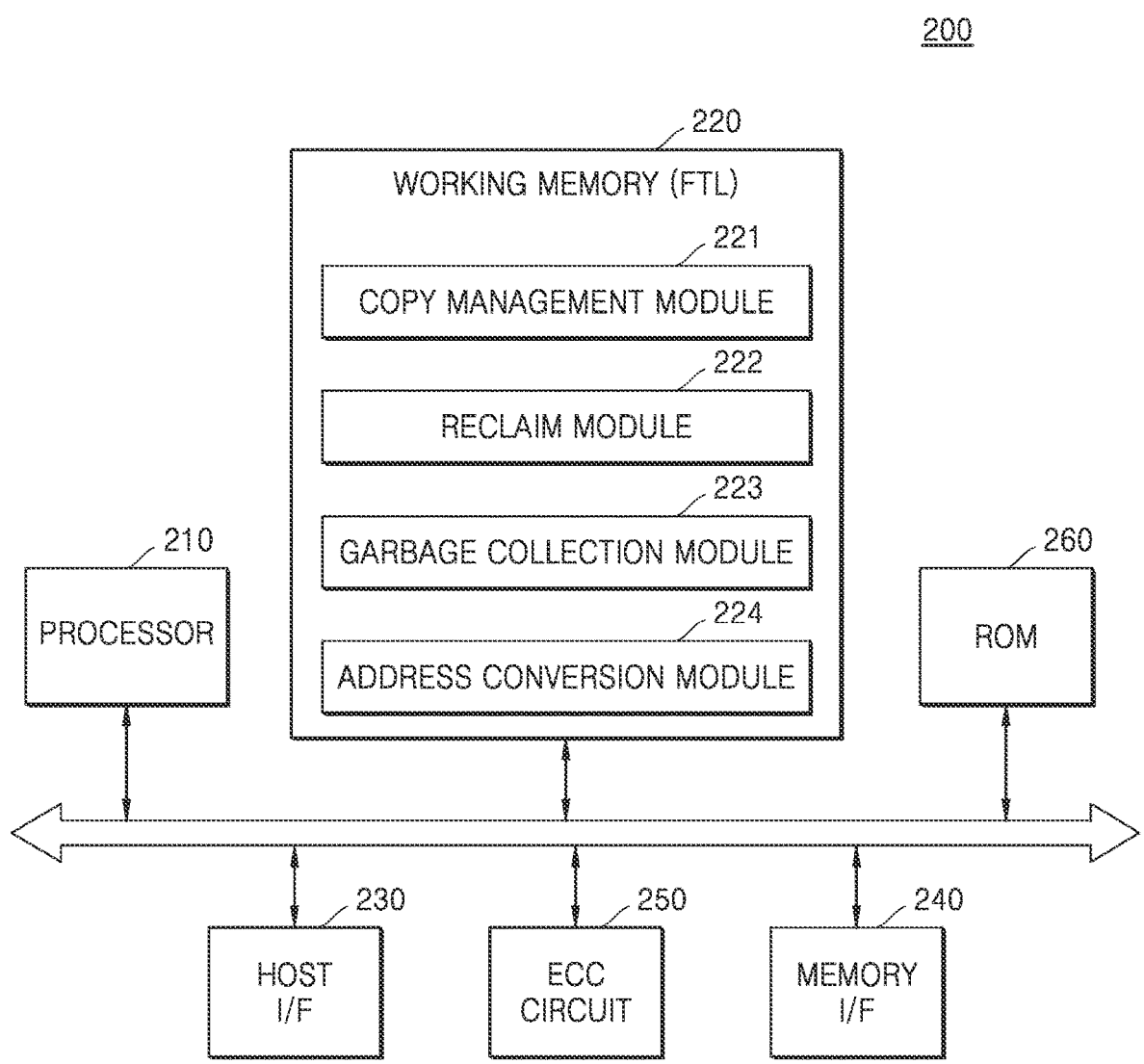
FIG. 3 illustrates a block diagram of an implementation of a memory controller, according to embodiments of the inventive concepts.

FIG. 3 illustrates a block diagram of an implementation of a memory controller 200, according to embodiments of the inventive concepts.

Referring to FIG. 3, the memory controller 200 may include a processor 210, a working memory 220, a host interface 230, a memory interface 240, an error correction code (ECC) circuit 250, and read-only memory (ROM) 260. The processor 210 may control the overall operation of the memory controller 200, and as an example, the processor 210 may control the overall operation of the memory controller 200 by executing firmware loaded into the working memory 220. The working memory 220 may include various types of memories, and for example, may include cache memory, dynamic random access memory (DRAM), static random access memory (SRAM), etc. Also, as an example of firmware, an FTL may be loaded into the working memory 220, and various functions related to a flash memory operation may be performed by executing various modules included in the FTL. In addition, the ROM 260 may store code data necessary for initial booting of a device in which the memory system is employed.

The host interface 230 may communicate with a host through various types of interfaces. Also, the memory interface 240 may provide a physical connection between the memory controller 200 and a memory device. For example, a command/address and data may be transmitted/received between the memory controller 200 and the memory device through the memory interface 240. Also, the ECC circuit 250 may perform ECC encoding processing on data requested to be written and may perform ECC decoding processing on read data.

According to embodiments of the inventive concepts, the working memory 220 may store various modules each including firmware, and as an example, the working memory 220 may store a copy management module 221, a reclaim module 222, a garbage collection module 223, and an address conversion module 224. According to the embodiment described above, when there is a possibility of data loss as a specific block of the memory device deteriorates, the processor 210 may control an operation of copying data of the deteriorated block to another block by executing the reclaim module 222. Also, in order to generate one or more free blocks, the processor 210 may control an operation of copying valid data stored in two or more source blocks to one or more other destination blocks by executing the garbage collection module 223.

In addition, the memory controller 200 may convert a logical address from a host into a physical address indicating a physical location of the memory device, and as an example, the processor 210 may manage mapping information between the logical address and the physical address by executing the address conversion module 224. For example, the mapping information between the logical address and the logical address may be stored in the working memory 220.

According to an example embodiment of the inventive concepts, when a data copy operation is performed, a copy location may be calculated (e.g., determined) based on a type of data. For example, the processor 210 may generate a copy address for copying a specific type of data to a deterioration region of a block by executing the copy management module 221.

When a RAID is used as an example, a plurality of pieces of user data and parity data constituting the RAID may be located in different blocks among a plurality of blocks in the memory device. When data stored in a first block is copied to another block by a reclaim operation and a garbage collection operation, the copy address may be generated so that user data stored in the first block is copied to a normal region of another block (e.g., a second block), whereas parity data stored in the first block is copied to a deterioration region of the second block.

When an error occurs in one piece of user data, remaining user data and parity data constituting the RAID may be read, and accordingly, the error may be repaired. According to an example embodiment of the inventive concept, because storage locations of user data and parity data in a block are changed according to the data copy operation, mapping information between the user data and the parity data constituting the RAID may be managed. As an example, the copy management module 221 may manage the mapping information between the user data and the parity data constituting the RAID and may also update the mapping information whenever a copy operation is performed. According to an example embodiment, the mapping information between the user data and the parity data may be stored in the working memory 220, and the mapping information between the user data and the parity data may be periodically or aperiodically provided to and stored in the memory device.

Figure 4:
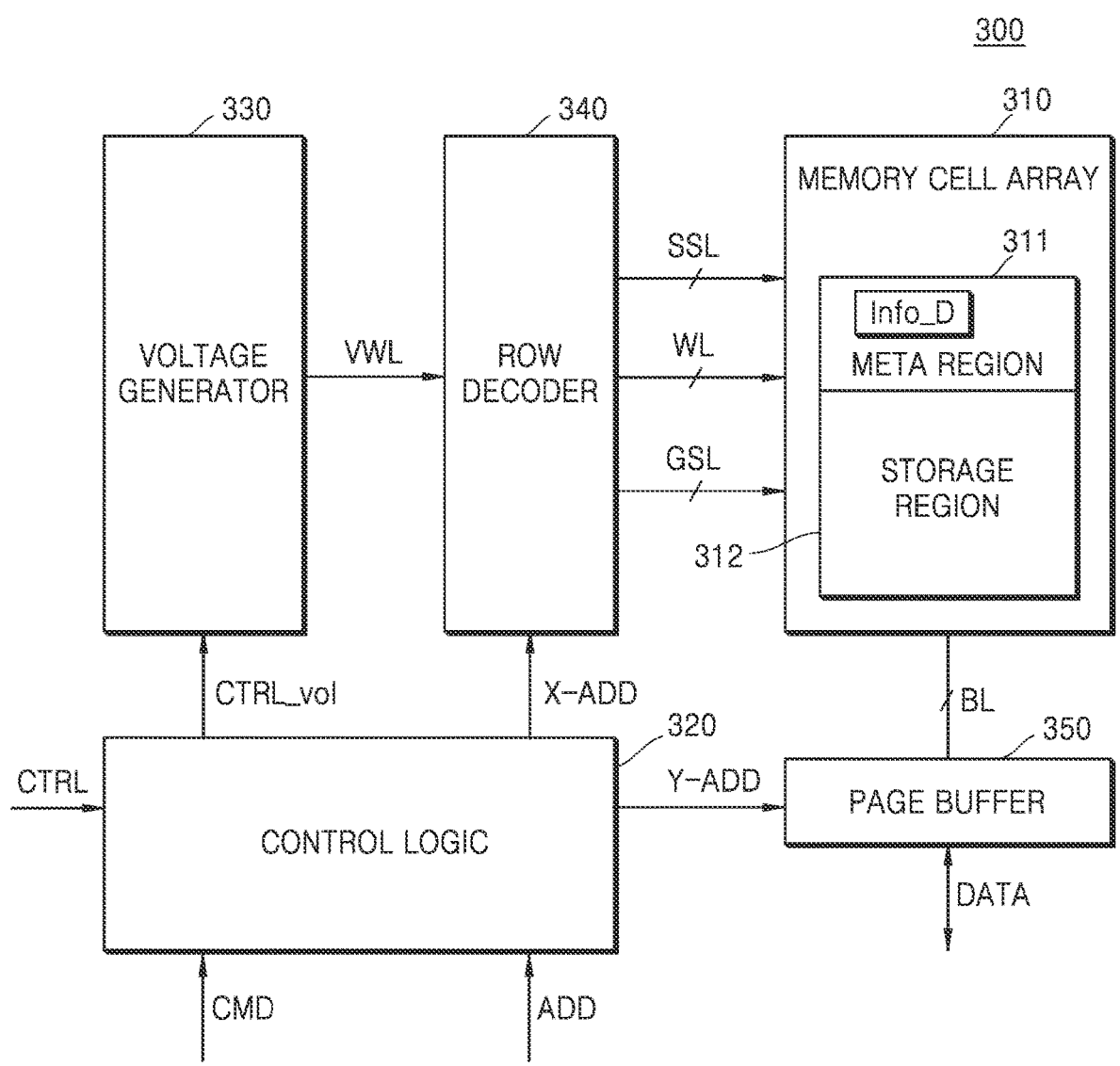
FIG. 4 illustrates a block diagram of a memory device according to embodiments of the inventive concepts.

FIG. 4 illustrates a block diagram of a memory device 300 according to embodiments of the inventive concepts.

Referring to FIG. 4, the memory device 300 may include a memory cell array 310, a control logic 320 (e.g., a control logic circuit), a voltage generator 330, a row decoder 340, and a page buffer 350. Though not shown in FIG. 4, the memory device 300 may further include various other components related to a memory operation, such as for example a data input/output circuit or an input/output interface.

The memory cell array 310 may include a plurality of memory cells and may be connected to word lines WL, string select lines SSL, ground select lines GSL, and bit lines BL. The memory cell array 310 may be connected to the row decoder 340 through the word lines WL, the string select lines SSL, and the ground select lines GSL, and may be connected to the page buffer 350 through the bit lines BL. Each of the memory cells may store one or more bits, and as an example, each memory cell may correspond to a multi-level cell (MLC), a triple-level cell (TLC), or a cell storing more bits.

According to an embodiment, the memory cell array 310 may include a two-dimensional memory cell array, and the two-dimensional memory cell array may include a plurality of cell strings arranged in row and column directions. Also, according to other embodiments, the memory cell array 310 may include a three-dimensional memory cell array, the three-dimensional memory cell array may include a plurality of cell strings, and each cell string may include memory cells respectively connected to word lines vertically stacked on a substrate. U.S. Pat. Nos. 7,679,133, 8,553,466, 8,654,587, 8,559,235, and US Patent Application Publication No. 2011/0233648, incorporated herein in their entirety by reference, disclose suitable configurations of a three-dimensional memory cell array which is constituted in multiple levels and in which word lines and/or bit lines are shared between the levels.

The control logic 320 may output various internal control signals for programming data into the memory cell array 310 or reading data from the memory cell array 310, based on a command CMD, an address ADD, and a control signal CTRL, which are received from a memory controller. The control logic 320 may provide a row address X-ADD to the row decoder 340 and provide a column address Y-ADD to the page buffer 350, based on the received address ADD. Also, the voltage generator 330 may generate various voltages used in the memory device 300, and as an example, the voltage generator 330 may provide a word line voltage VWL having various levels related to program, read, and erase operations. The control logic 320 may output a voltage control signal CTRL_vol for controlling a level of the word line voltage VWL generated from the voltage generator 330. For example, when a data copy operation is performed, control logic 320 may output control signals and provide a copy address of a copy location determined by processor 210 of the memory controller 200 based on a type of data. For example, the control logic 320 may output control signals and provide a copy address for copying a specific type of data to a deterioration region of a block.

In addition, the memory cell array 310 may include a meta region 311 and a storage region 312. The meta region 311 may store various types of information for managing data stored in the storage region 312. According to embodiments of the inventive concepts, during a manufacturing process of the memory device 300, a plurality of blocks of the memory cell array 310 may be tested, and deterioration information Info_D indicating locations of one or more word lines included in a deterioration region of each block may be stored in the meta region 311 in a non-volatile manner. When the memory system is initially driven, the deterioration information Info_D read from the meta region 311 may be provided to the memory controller. The memory controller may determine a type of data to be copied and may control a copy operation based on the deterioration information Info_D received from the memory device 300, so that a specific type of data is copied to a deterioration region of each block.

Figure 5:
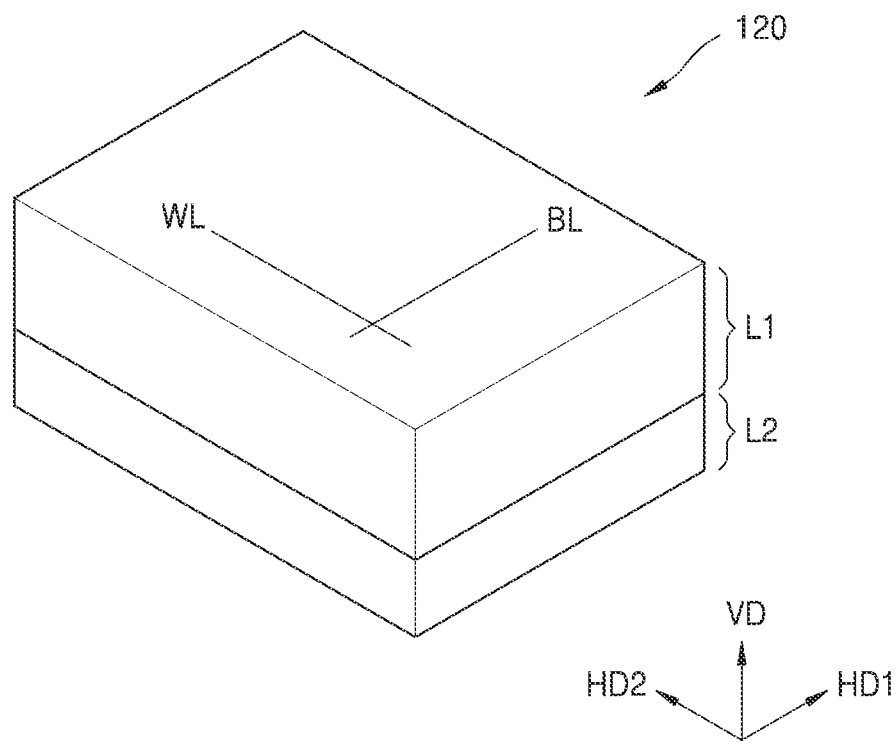
FIG. 5 illustrates a schematic diagram of a structure of a memory device of FIG. 1, according to embodiments of the inventive concepts.
Figure 6:
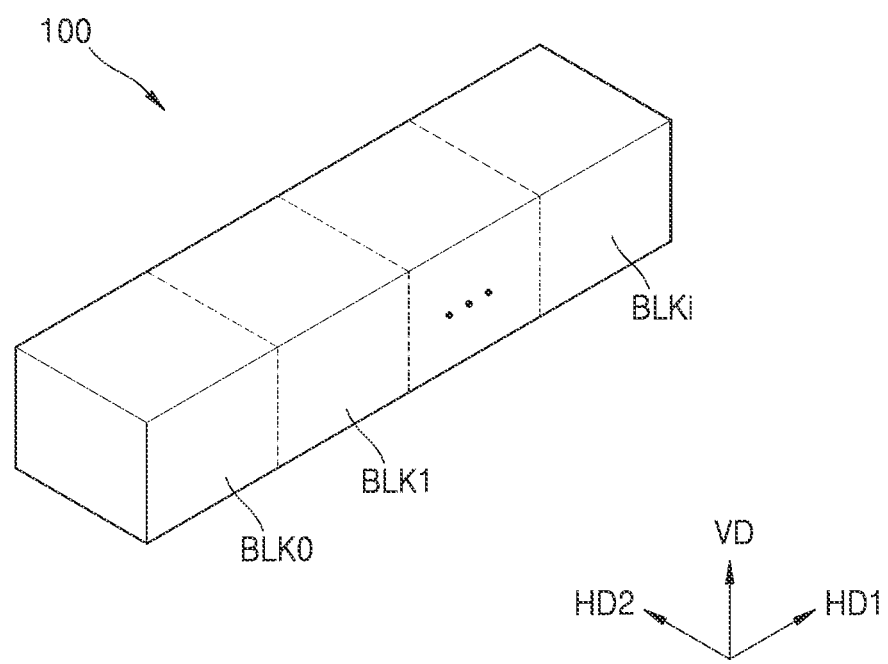
FIG. 6 illustrates a diagram of an example of a memory cell array of FIG. 1.
Figure 7:
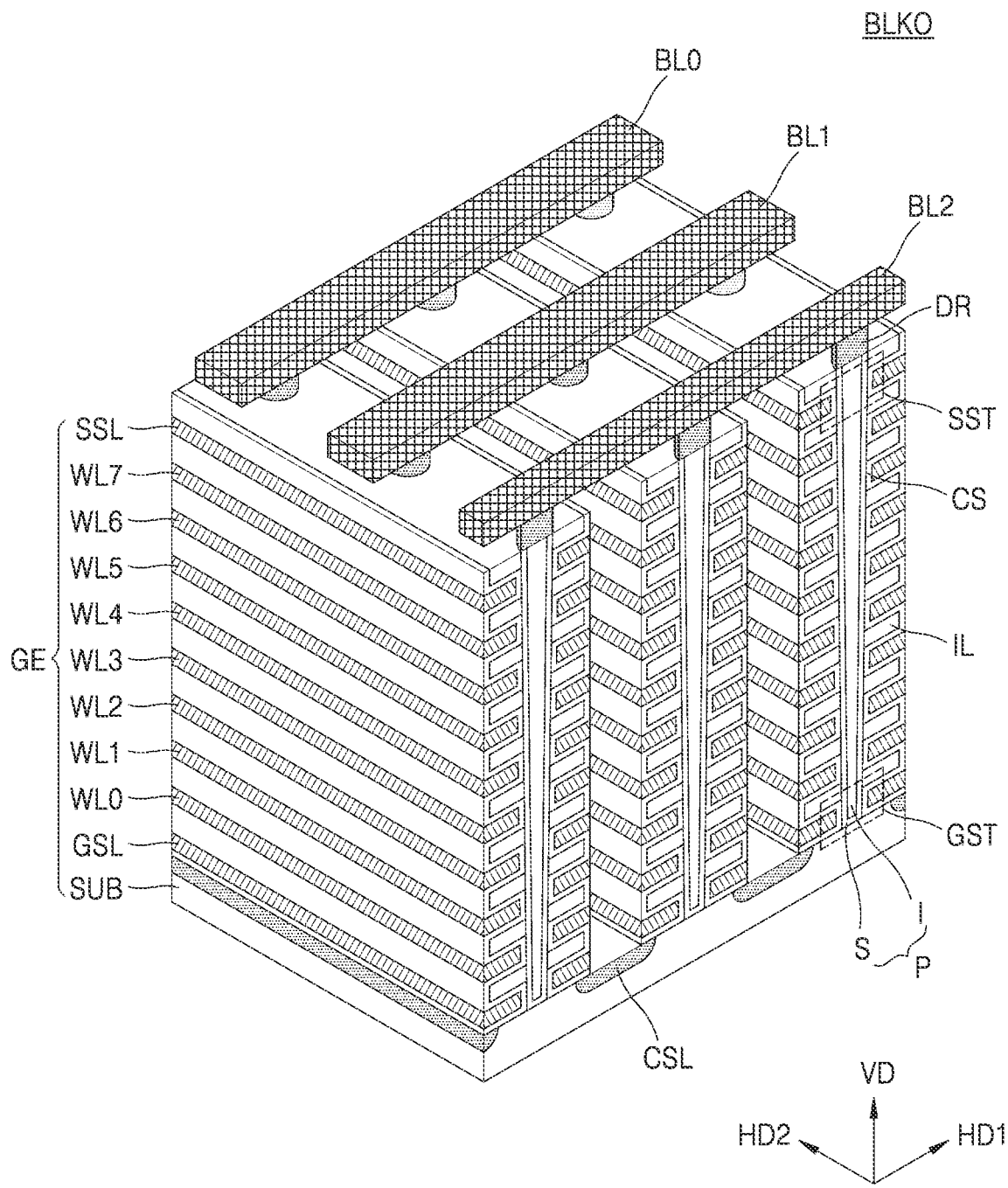
FIG. 7 illustrates a perspective view of an example of a structure of a cell block of FIG. 6.

FIG. 5 illustrates a schematic diagram of a structure of a memory device of FIG. 1, according to embodiments of the inventive concepts. FIG. 6 illustrates a diagram of an example of a memory cell array of FIG. 1. FIG. 7 illustrates a perspective view of an example of a structure of a cell block (or a memory block) of FIG. 6. FIG. 5 illustrates a cell over periphery (COP) structure as an implementation of the memory device, but embodiments of the inventive concepts are not necessarily limited thereto, and the memory device may be implemented by various structures.

Referring to FIG. 5, the memory device 120 may include a first semiconductor layer L1 and a second semiconductor layer L2, and the first semiconductor layer L1 may be stacked in a vertical direction VD with respect to the second semiconductor layer L2. In detail, the second semiconductor layer L2 may be arranged below the first semiconductor layer L1 in the vertical direction VD, and accordingly, the second semiconductor layer L2 may be arranged close to a substrate (not shown).

According to an embodiment, the memory cell array 121 of FIG. 1 may be formed in the first semiconductor layer L1, and peripheral circuits of FIG. 1 may be formed in the second semiconductor layer L2. Accordingly, the memory device 120 may have a structure in which a memory cell array is arranged above a peripheral circuit, that is, a COP structure. The COP structure may efficiently reduce a horizontal area and may improve the degree of integration of the memory device 120.

According to an embodiment, the second semiconductor layer L2 may include a substrate, and by forming, on the substrate, transistors and metal patterns for wiring the transistors, the peripheral circuit may be formed in the second semiconductor layer L2. After the peripheral circuit is formed in the second semiconductor layer L2, the first semiconductor layer L1 including a memory cell array may be formed, and metal patterns for electrically connecting word lines WL and bit lines BL of the memory cell array to the peripheral circuit formed in the second semiconductor layer L2 may be formed. For example, the bit lines BL may extend in a first horizontal direction HD1, and the word lines WL may extend in a second horizontal direction HD2.

Referring to FIG. 6, the memory cell array may include a plurality of blocks BLK0 to BLKi, where i may be a positive integer. Each of the plurality of blocks BLK0 to BLKi may have a three-dimensional structure (or a vertical structure). In detail, each of the plurality of blocks BLK0 to BLKi may include a plurality of cell strings extending in the vertical direction VD. In this case, the plurality of cell strings may be spaced apart a specific distance from each other in the first and second horizontal directions HD1 and HD2. The plurality of blocks BLK0 to BLKi may be selected by a row decoder (not shown) of the memory device. For example, the row decoder may select a block corresponding to a block address from among the plurality of blocks BLK0 to BLKi.

Referring to FIG. 7, the block BLK0 may be formed in a vertical direction with respect to a substrate SUB. The substrate SUB has a first conductivity type (e.g., p-type), and a common source line CSL extending in the second horizontal direction HD2 and doped with impurities of a second conductivity type (e.g., n-type) is provided on the substrate SUB. A plurality of insulating layers IL extending in the second horizontal direction HD2 are sequentially provided in the vertical direction VD in a region of the substrate SUB between two adjacent common source lines CSL, and the plurality of insulating layers IL are spaced apart a specific distance from each other in the vertical direction VD. For example, the plurality of insulating layers IL may include an insulating material, such as silicon oxide.

A plurality of pillars P sequentially arranged in the first horizontal direction HD1 and penetrating the plurality of insulating layers IL in the vertical direction VD are provided in the region of the substrate SUB between the adjacent two common source lines CSL. For example, the plurality of pillars P may penetrate the plurality of insulating layers IL and be in contact with the substrate SUB. In detail, a surface layer S of each pillar P may include a silicon material having a first type and may function as a channel region. In addition, an inner layer I of each pillar P may include an insulating material, such as silicon oxide, or an air gap.

A charge storage layer CS is provided in a region between the two adjacent common source lines CSL along exposed surfaces of the insulating layers IL, the pillars P, and the substrate SUB. The charge storage layer CS may include a gate insulating layer (also referred to as a tunneling insulating layer), a charge trapping layer, and a blocking insulating layer. For example, the charge storage layer CS may have an oxide-nitride-oxide (ONO) structure. Also, a gate electrode GE, such as select lines GSL and SSL and word lines WL0 to WL7, is provided on an exposed surface of the charge storage layer CS in the region between the two adjacent common source lines CSL. For example, a string selection transistor SST is disposed at a top of the pillar P as formed at the string select line SSL and the charge storage layer, and a ground selection transistor GST is disposed at a bottom of the pillar P as formed at the ground select line GSL and the charge storage layer Drains or drain contacts DR are on the plurality of pillars P, respectively. For example, the drains or drain contacts DR may include a silicon material doped with impurities having a second conductivity type. Bit lines BL1 to BL3 extending in the first horizontal direction HD1 and spaced apart a specific distance from each other in the second horizontal direction HD2 are provided on the drains or drain contacts DR.

Figure 8:
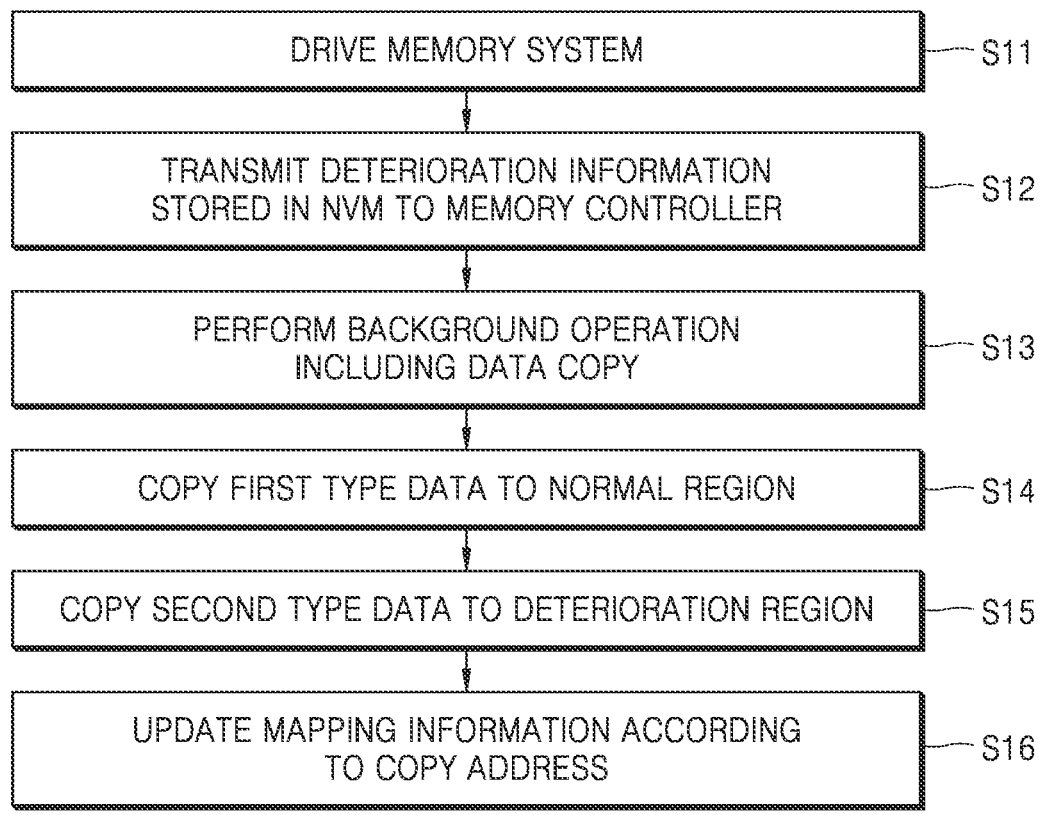
FIG. 8 illustrates a flowchart descriptive of an operating method of a memory system, according to embodiments of the inventive concepts.

FIG. 8 illustrates a flowchart explanatory of an operating method of a memory system, according to embodiments of the inventive concepts.

Referring to FIG. 8, the memory system includes a memory controller (e.g., 200 in FIG. 3) and a memory device (e.g., 300 in FIG. 4), and the memory system is initially driven (S11). During an initial driving process, deterioration information stored in a nonvolatile memory NVM of the memory device may be read and transmitted to the memory controller (S12), and after initial driving is completed, the memory system may perform a memory operation upon a request from a host.

The memory system may periodically or aperiodically perform a management operation for the memory device, and as an example, the memory system may perform a background operation including a data copy operation (S13). According to the embodiments described above, the background operation may include various management operations, such as a reclaim operation and a garbage collection operation.

According to an example embodiment of the inventive concepts, when data of a first block is copied to a second block, a copy location in the second block may be calculated (e.g., determined) based on a result of determining types of data of the first block. As an example, according to the types of data, an address indicating a word line in a normal region of the second block may be calculated (e.g., determined), or an address indicating a word line in a deterioration region may be calculated (e.g., determined).

First type data stored in the first block and having a relatively high access frequency may be copied to a normal region of the second block (S14). Also, second type data stored in the first block and having a relatively low access frequency may be copied to a deterioration region of the second block (S15). For example, a plurality of pieces of user data constituting a RAID may be determined to be first type data, and parity data may be determined to be second type data. In some embodiments, the order of sequentially copying may instead be copying the second type data (S15) followed by copying the first type data (S14).

According to an example embodiment, when the second block is classified into one normal region and one deterioration region, the first type data may be copied to an arbitrary word line in the normal region, and the second type data may also be copied to an arbitrary word line in the deterioration region. Alternatively, when the memory cell array has a three-dimensional structure and each of the normal region and the deterioration region includes a plurality of word lines, the first type data may be sequentially copied starting from a lower word line in the normal region, and the second type data may also be sequentially copied starting from a lower word line in the deterioration region.

According to an example embodiment of the inventive concepts, mapping information may be updated (e.g., by copy management module 221 in FIG. 3) according to a copy address generated by the data copy operation (S16). For example, one piece of data of the first block may constitute a RAID with other data of other blocks, and the mapping information may be constituted in RAID units. Also, as the data stored in the first block is copied to the second block and a storage location thereof is changed, an address corresponding to the data of the first block included in the mapping information may be updated to the copy address described above. Thereafter, when an error occurs in one piece of user data during a memory operation, an error repair operation may be performed based on the updated mapping information.

According to the embodiments of the inventive concepts described above, because a region is defined considering the sensitivity of each word line to read disturbance, and a data copy location may be designated based on a type of data, data having a high access frequency is copied to a word line that is resistant to read disturbance, and data having a low access frequency is copied to a word line that is relatively sensitive to read disturbance, and thus, overall data reliability may be improved.

Figure 9A:
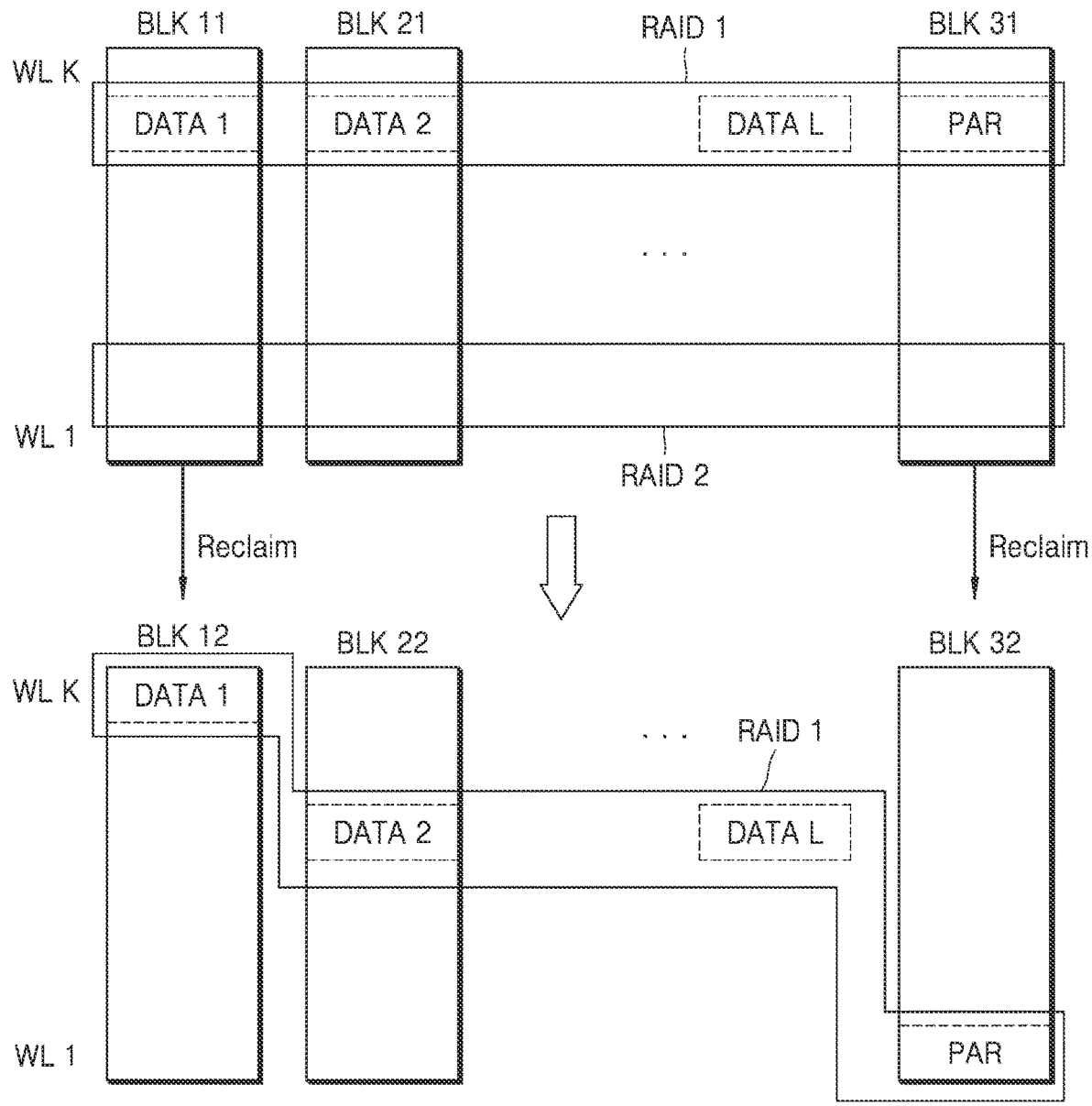
FIG. 9A illustrates a diagram of an example of a data copy operation.
Figure 9B:
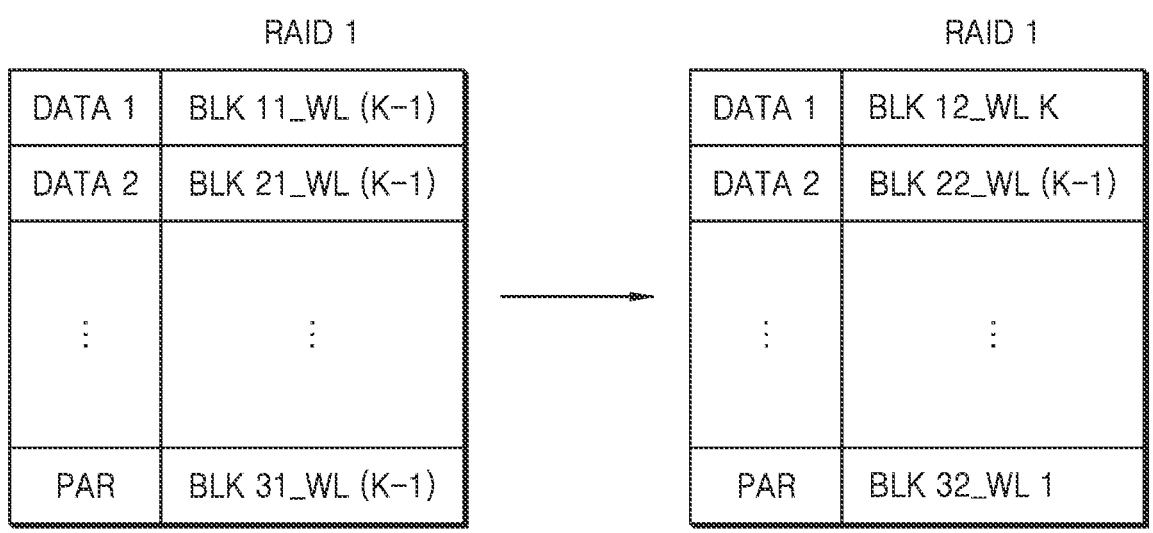
FIG. 9B illustrates an example of mapping information of the data copy operation.

FIGS. 9A and 9B illustrate diagrams of an example of a data copy operation and mapping information. In the embodiments shown in FIGS. 9A and 9B, it may be assumed that a plurality of pieces of user data and parity data corresponding to the plurality of pieces of user data, which constitute a RAID, are stored in blocks of different memory devices (or flash memory chips). For example, data constituting a plurality of RAIDs (e.g., a first RAID RAID 1 and a second RAID RAID 2) may be stored in a plurality of flash memory chips. When the first RAID RAID 1 is used as an example, it is assumed that first user data DATA 1 is stored in a first flash memory chip, second user data DATA 2 is stored in a second flash memory chip, and parity data PAR is stored in a third flash memory chip. Also, regarding a reclaim operation, a block storing data to be copied is referred to as a first block, and a block to which data is copied is referred to as a second block.

Referring to FIG. 9A, first user data DATA 1 to L-th user data DATA L and parity data PAR corresponding to the first user data DATA 1 to the L-th user data DATA L may constitute a first RAID RAID 1, the first user data DATA 1 may be stored in a first block BLK 11 of the first flash memory chip, the second user data DATA 2 may be stored in a first block BLK 21 of the second flash memory chip, and the parity data PAR may be stored in a first block BLK 31 of the third flash memory chip. Also, each block may include a first word line WL 1 to a K-th word line WL K, and according to a height of a word line, the first word line WL1 may correspond to a word line that is relatively sensitive to read disturbance, whereas the K-th word line WL K may correspond to a word line that is relatively resistant to read disturbance. Accordingly, one or more word lines including the first word line WL1 may be defined as a deterioration region in each block, and one or more word lines including the K-th word line WL K may be defined as a normal region in each block.

As a reclaim operation is performed on the first block BLK 11 of the first flash memory chip, the first user data DATA 1 of the first flash memory chip may be copied to a second block BLK 12. In this case, as the first user data DATA 1 is determined to be first type data, the first user data DATA 1 may be copied to a word line (e.g., the K-th word line WL K) of a normal region of the second block BLK 12.

On the contrary, as a reclaim operation is performed on the first block BLK 31 of the third flash memory chip, the parity data PAR of the third flash memory chip may be copied to a second block BLK 32. In this case, as the parity data PAR is determined to be second type data, the parity data PAR may be copied to a word line (e.g., the first word line WL1) of a deterioration region of the second block BLK 32.

In an embodiment of the inventive concepts, as another example with respect to FIG. 9A and continuing with a similar convention of first to L-th blocks, wherein the plurality of blocks include a first block (e.g., BLK 11) and a second block (e.g., BLK 21) to an L-th block (e.g., the block storing DATA L) (provided that L is an integer of 3 or more), first (e.g., DATA 1) to L-th user data (e.g., DATA L) stored in the first block (e.g., BLK 11) to the L-th block (e.g., the block storing DATA L) and first parity data (e.g., PAR) stored in the (L+1)th block (e.g., BLK 31) constitute a first RAID (e.g., (RAID 1), an operating method may include in response to a reclaim operation being performed on the first block (e.g., BLK 11), copying the first user data (e.g., DATA 1) to a normal region of an (L+2)th block (e.g., BLK 12); and in response to a reclaim operation being performed on the (L+1)th block (e.g., BLK 31), copying the first parity data (e.g., PAR) to a deterioration region of an (L+3)th block (e.g., BLK 32). The reclaim operation is not limited to this described embodiment, and reclaim operations may be performed in variously different manners.

In the embodiment of FIG. 9A described above, it is illustrated that, when each piece of user data or parity data is copied, data of the first block is copied to a second block of the same flash memory chip, but in a reclaim operation and/or a garbage collection operation, the user data or the parity data may also be copied to blocks included in different flash memory chips.

Referring to FIG. 9B, mapping information may be managed in RAID units, and accordingly, mapping information between the first to L-th user data DATA 1 to DATA L and the parity data PAR of the first RAID RAID 1 may be updated by the copy operation described above. For example, the memory controller may manage, as mapping information, addresses of blocks and word lines indicating storage locations of data constituting the first RAID RAID 1. As an example, copy addresses of the first user data DATA 1 and the parity data PAR constituting the first RAID RAID 1 may be updated in the mapping information.

Figure 10:
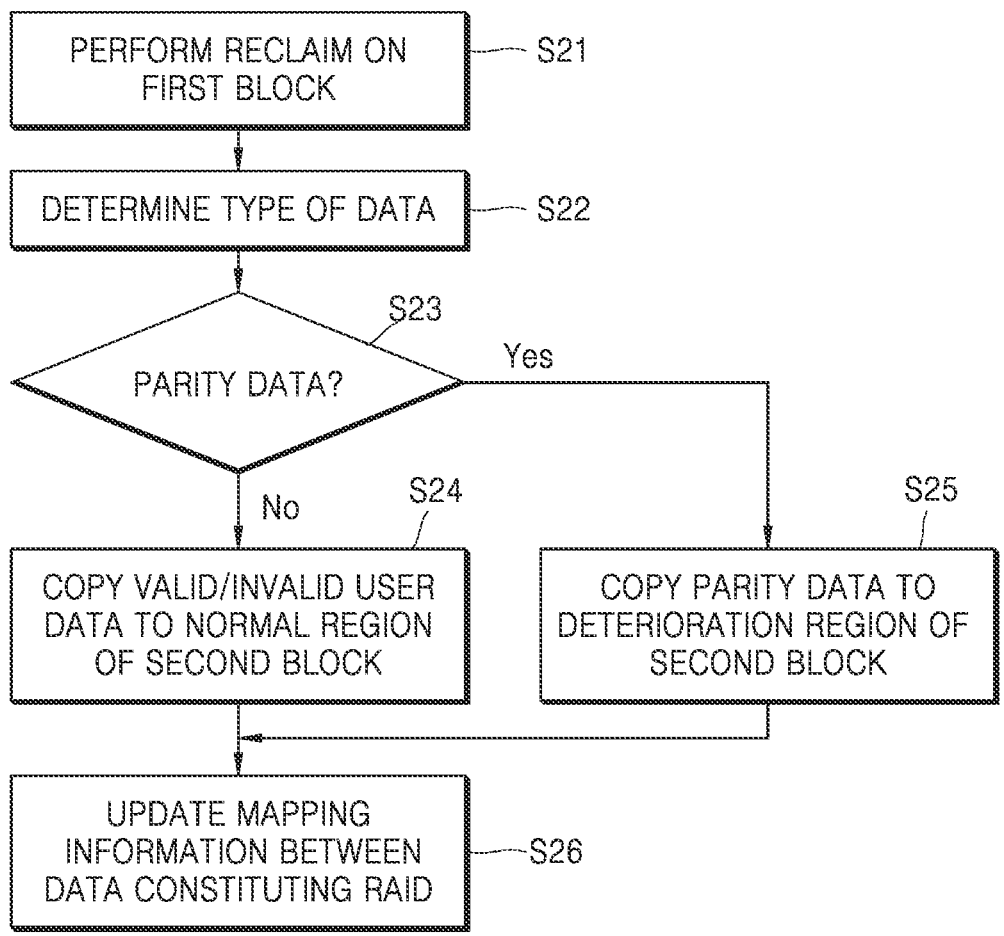
FIG. 10 illustrates a flowchart descriptive of an example of a copy operation in a reclaim operation according to embodiments of the inventive concepts.
Figure 11:
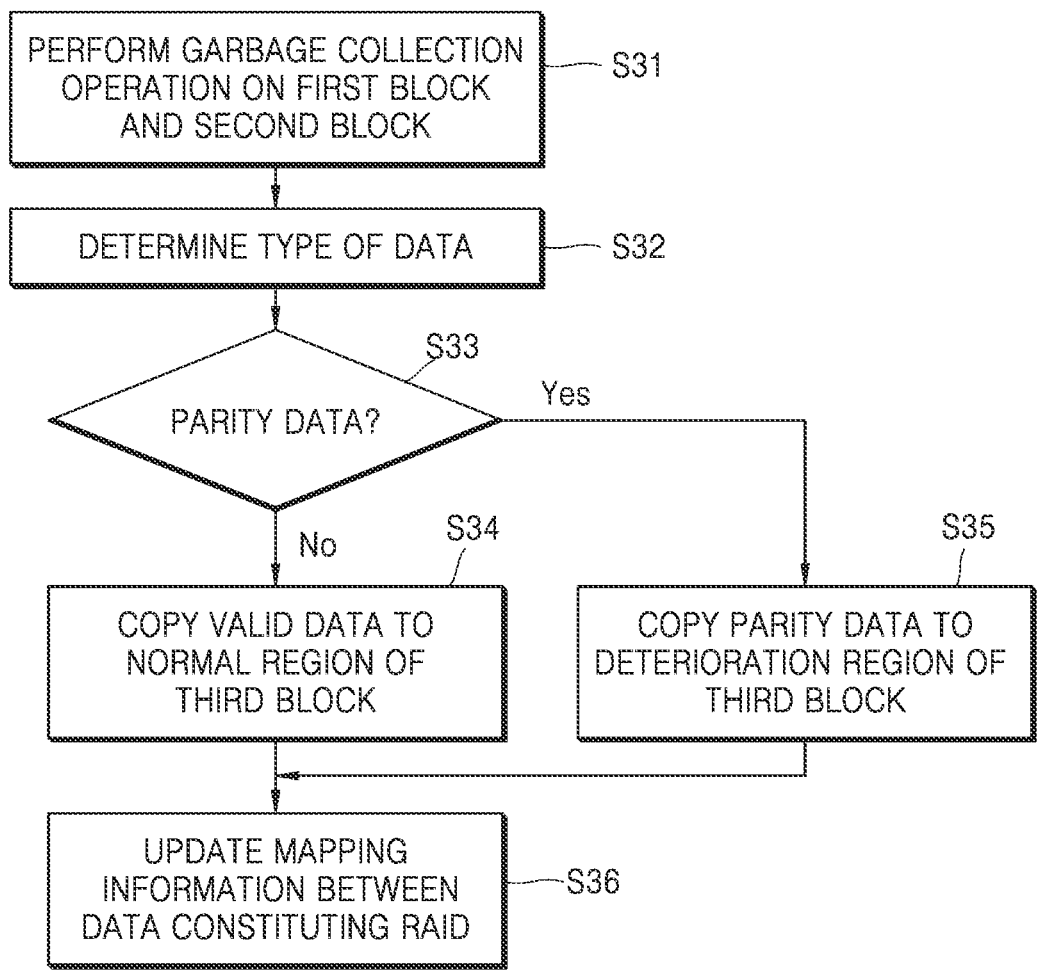
FIG. 11 illustrates a flowchart descriptive of an example of a copy operation in a garbage collection operation according to embodiments of the inventive concepts.

FIGS. 10 and 11 illustrate flowcharts explanatory of an example of a copy operation of the inventive concepts respectively in a reclaim operation and a garbage collection operation.

Referring to FIG. 10, because a first block of a specific memory device (or flash memory chip) deteriorates for reasons such as increased erase/write cycles, a reclaim operation in which data stored in the first block is copied to one or more other blocks may be performed (S21), and it is assumed that the data stored in the first block is copied to a second block. A copy management module (e.g., 221 of FIG. 3) of the memory controller may determine types of respective data stored in the first block (S22), and accordingly, may determine whether respective data corresponds to parity data (S23). Determination of whether data corresponds to parity data may be performed by various methods. As an example, in a data recording process, a location in which the parity data is stored may be managed by the memory controller, and it may be determined whether the data corresponds to the parity data, based on a location in which data to be copied is stored.

When the data to be copied corresponds to parity data, the parity data may be copied to a deterioration region including one or more word lines of the second block (S25). On the contrary, when the data to be copied corresponds to user data, the user data may be copied to a normal region data including one or more other word lines of the second block (S24). According to the reclaim operation described above, storage locations of user data and/or parity data constituting a RAID may be changed, and accordingly, mapping information between data constituting the RAID may be updated (S26).

According to an example embodiment of the inventive concepts, in the reclaim operation, both valid user data (hereinafter, referred to as valid data) and invalid user data (hereinafter, referred to as invalid data), which are stored in the first block, may be copied. In this case, the invalid data may not be actually accessed, and accordingly, it may be further determined whether the data to be copied corresponds to valid data or invalid data. Also, the normal region may be classified into a first normal region that is relatively more resistant to read disturbance, and a second normal region that is more sensitive to read disturbance than the first normal region, and the copy operation may also be controlled so that valid data is copied to the first normal region and invalid data is copied to the second normal region.

Referring to FIG. 11, in order to generate one or more free blocks, valid data of at least two source blocks may be copied to a destination block, and it is assumed that first and second blocks correspond to the source blocks and a third block corresponds to the destination block. Accordingly, a garbage collection operation may be performed on the first and second blocks (S31).

Valid data and parity data among the data stored in the first and second blocks may be selectively copied to a third block, and a type of data to be copied may be determined (S32). As an example, it may be determined whether respective data corresponds to parity data (S33). When the data to be copied corresponds to parity data, the parity data may be copied to a deterioration region including one or more word lines of the third block (S35). On the contrary, when the data to be copied corresponds to valid data, the valid data may be copied to a normal region including one or more other word lines of the third block (S34). According to the garbage collection operation described above, storage locations of user data and/or parity data constituting a RAID may be changed, and accordingly, mapping information between data constituting the RAID may be updated (S36).

Figure 12:
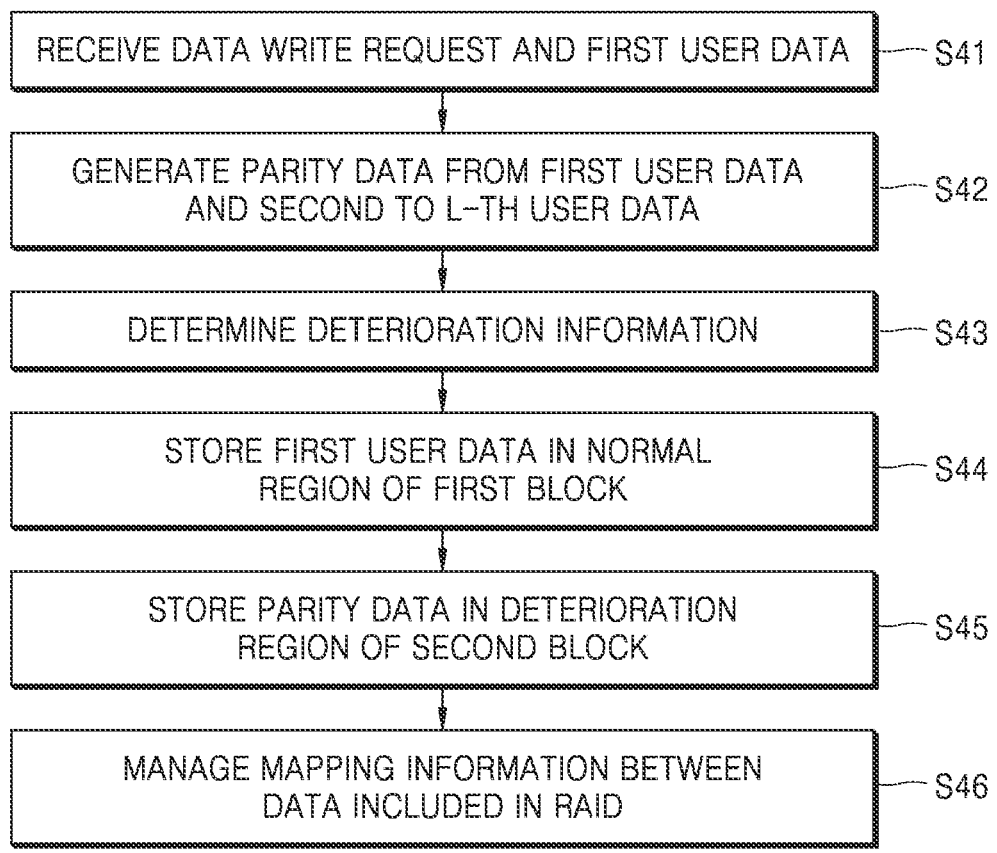
FIG. 12 illustrates a flowchart descriptive of a case in which embodiments of the inventive concepts are applied in a data write process.

FIG. 12 illustrates a flowchart explanatory of a case in which an embodiment of the inventive concepts is applied in a data write process.

Referring to FIG. 12, as the embodiments of the inventive concepts are applied in a data write process, a specific type of data may be stored in a deterioration region of a block. For example, the memory controller may receive a data write request and first user data from a host (S41).

The memory controller may read second user data to L-th user data from the memory device as user data constituting one RAID together with the first user data, and may generate parity data by using the first user data and the second to L-th user data read from the memory device from the host (S42). Also, the memory controller may control a write operation of the first user data and the parity data, and may determine deterioration information according to the embodiments of the inventive concept (S43).

The memory controller may calculate (e.g., determine), based on a result of determining the deterioration information, an address indicating a location in which the first user data and the parity data are to be stored, and the first user data and the parity data may be stored in different blocks. For example, the first user data may be stored in a normal region of a first block of the memory device (S44), whereas the parity data may be stored in a deterioration region of a second block of the memory device (S45). Also, based on the write operation described above, mapping information between data constituting a RAID may be managed (S46). In some embodiments, the sequential order of (S44) and (S45) may be switched.

According to the embodiment described above, in a data write process, according to types of data, the user data may be written to the normal region and the parity data may be written to the deterioration region, and accordingly, in the data write process, parity data having a relatively low access frequency may be stored in a deterioration region of each block, considering the sensitivity to read disturbance. That is, according to the embodiments of the inventive concepts, a copy location calculation operation may also be used to store a location of the parity data generated in the data write process upon a request from the host.

Figure 13:
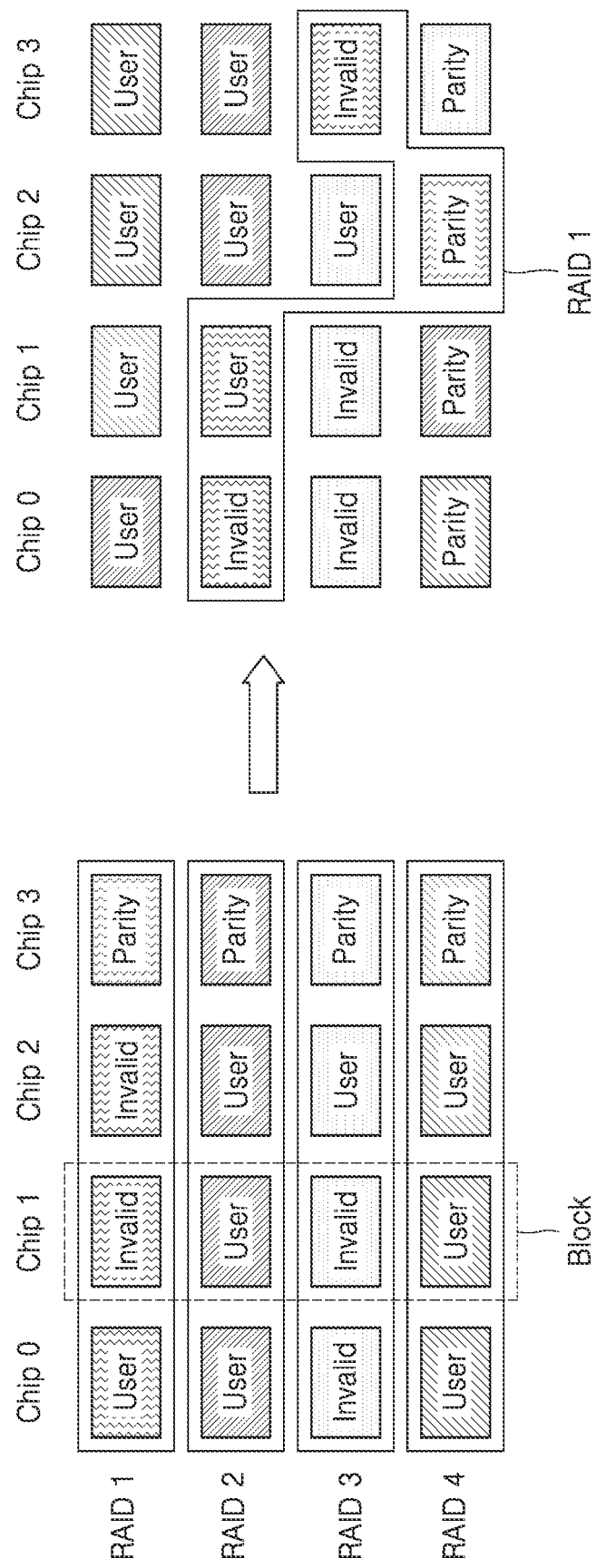
FIG. 13 illustrates a diagram explanatory of a specific implementation of a copy operation as a reclaim operation, according to embodiments of the inventive concepts.
Figure 14:
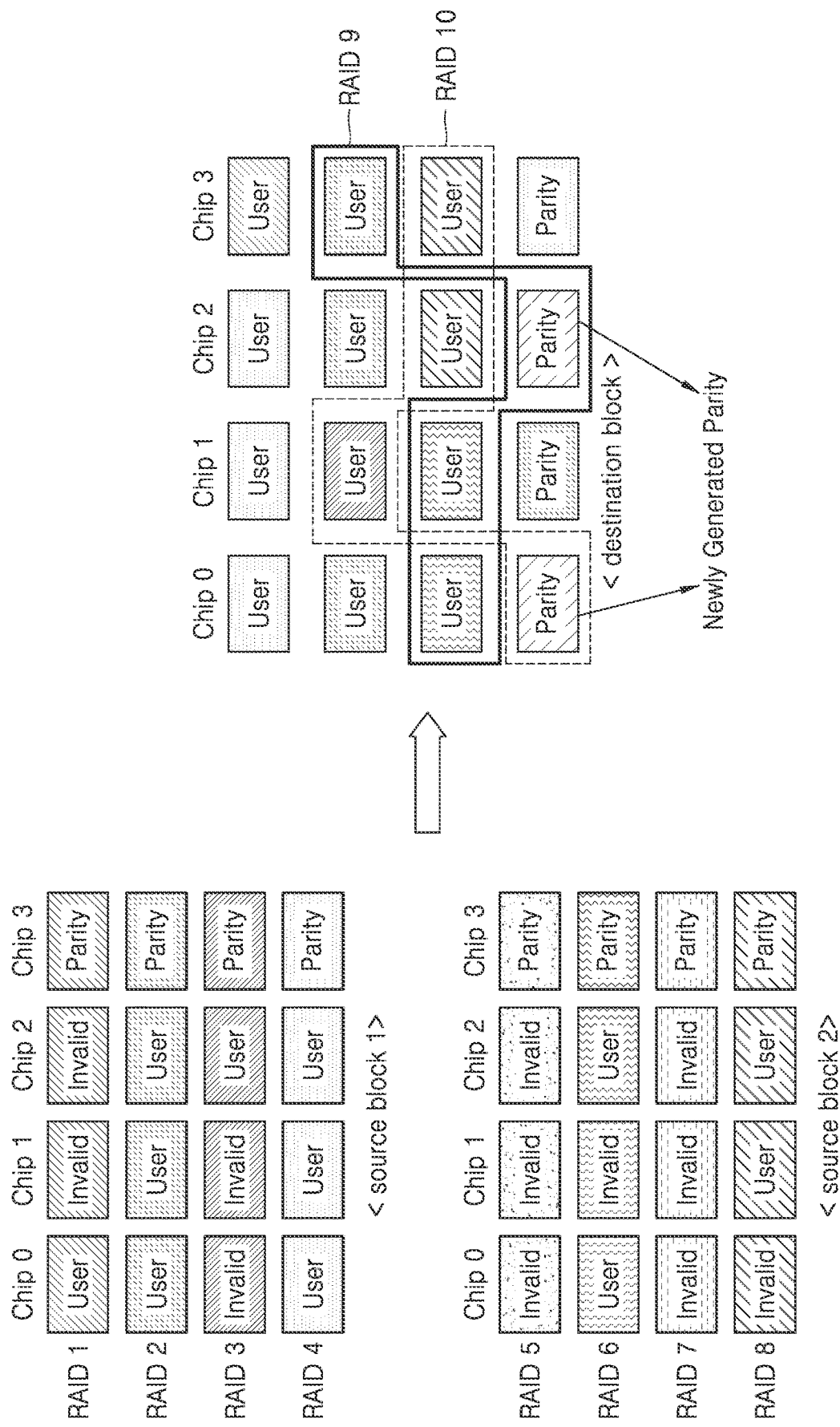
FIG. 14 illustrates a diagram explanatory of a specific implementation of a copy operation as a garbage collection operation, according to embodiments of the inventive concepts.

FIGS. 13 and 14 illustrate diagrams of a specific implementation of a copy operation, according to example embodiments of the inventive concepts. In FIGS. 13 and 14, data stored in one block included in each of a plurality of chips is illustrated, and each piece of user data and parity data of a preset unit constituting a RAID may indicate data stored in one word line.

Referring to FIG. 13, in a reclaim operation, a copy operation may be performed on all user data (valid data User and invalid data Invalid) included in a block to ensure a sequential characteristic of data. According to an example embodiment of the inventive concepts, when data is copied in the reclaim operation, user data of a RAID having a large amount of valid data among data constituting the RAID may be copied to word lines that are resistant to read disturbance. For example, a case is illustrated in which a first flash memory chip Chip 0 to a fourth flash memory chip Chip 3 are included in the memory device, a memory cell array of each memory chip has a three-dimensional structure, and in each block, lower word lines have a sensitive characteristic to read disturbance and upper word lines have a resistant characteristic to read disturbance. Also, in FIG. 13, one block in each of the first to fourth flash memory chips Chip 0 to Chip 3 and four word lines in each block are illustrated.

User data and parity data constituting one RAID are stored in specific locations (e.g., word lines of the same height) in blocks of different flash memory chips, and when a case in which the parity data is stored in a specific chip (e.g., the fourth flash memory chip Chip 3) is used as an example, as shown on the left side of FIG. 13, the user data constituting a first RAID RAID 1 to a fourth RAID RAID 4 may be evenly stored in word lines that are sensitive to read disturbance and word lines that are resistant to read disturbance in a block.

However, according to example embodiments of the inventive concepts, when the reclaim operation is performed, user data of the second and fourth RAIDs RAID 2 and RAID 4 having a relatively large amount of valid data may be copied to word lines that are relatively resistant to read disturbance, and parity data of the first to fourth RAIDs RAID 1 to RAID 4 may be copied to word lines of a deterioration region, which are sensitive to read disturbance. Referring to FIG. 13, as an example, user data of the second and fourth RAIDs RAID 2 and RAID 4 having a relatively large amount of valid data may be copied to word lines of an upper region of each of the first to fourth flash memory chips Chip 0 to Chip 3, and user data of the first and third RAIDS RAID 1 and RAID 3 having a relatively small amount of valid data may be copied to lower word lines of each of the first to fourth flash memory chips Chip 0 to Chip 3.

According to the embodiment of FIG. 13, user data and parity data constituting each RAID are stored in different flash memory chips, and because storage locations of the user data and the parity data constituting each RAID in the block are changed by the reclaim operation, a management operation in which mapping information is updated and stored according to a result of performing the reclaim operation may be performed. For example, as shown on the right side of FIG. 13, parity data of the first RAID RAID 1 previously stored in a word line of the normal region may be copied to a word line of the deterioration region.

Referring to FIG. 14, as a garbage collection operation is performed, only valid data in at least two source blocks may be selectively copied to one or more destination blocks. In FIG. 14, a case is illustrated in which valid data of two source blocks located in each of the first to fourth flash memory chips Chip 0 to Chip 3 is copied to one destination block of each of the first to fourth flash memory chips Chip 0 to Chip 3, and a case is also illustrated in which data constituting a first RAID RAID 1 to an eighth RAID RAID 8 is stored in source blocks of the first to fourth flash memory chips Chip 0 to Chip 3.

In the garbage collection operation, only valid data is selectively copied to a destination block, and thus, invalid data among data constituting RAIDs is not copied to the destination block. Accordingly, when the garbage collection operation is performed, a RAID may be newly constituted, and parity data may be newly calculated (e.g., determined).

According to an example embodiment of the inventive concepts, as shown in FIG. 14, as valid data among user data included in the first to eighth RAIDs RAID 1 to RAID 8 is selectively copied to the destination block, all of user data of the second and fourth RAIDs RAID 2 and RAID 4 may be copied to the destination blocks, and accordingly, parity data of the second and fourth RAIDs RAID 2 and RAID 4 may be copied to word lines of a deterioration region of the destination block.

In addition, as user data of the fifth and seventh RAIDs RAID 5 and RAID 7 not including valid data are not copied to the destination blocks, the fifth and seventh RAIDs RAID and RAID 7 may be removed.

Moreover, in the first, third, sixth, and eighth RAIDS RAID 1, RAID 3, RAID 6, and RAID 8 including both valid data and invalid data, as the valid data is selectively copied to the destination blocks, one or more RAIDs may be newly constituted, and parity data corresponding to each RAID may be newly calculated. For example, valid data of the first, third, sixth, and eighth RAIDS RAID 1, RAID 3, RAID 6, and RAID 8 may be copied to the destination blocks, and the valid data copied to the destination blocks may constitute a ninth RAID RAID 9 and a tenth RAID RAID 10. Also, parity data corresponding to each of the ninth and tenth RAIDs RAID 9 and RAID 10 may be newly calculated, and the parity data of the second and fourth RAIDs RAID 2 and RAID 4 and the parity data of the ninth and tenth RAIDs RAID 9 and RAID may be copied to word lines of deterioration regions of the destination blocks.

As described above, because the parity data is recalculated (e.g., determined again) and copied to the deterioration regions according to the garbage collection operation, a management operation in which mapping information is updated and stored according to a result of performing the garbage collection operation may be performed.

In an embodiment of the inventive concepts, as another example with respect to FIG. 14 and continuing with a similar convention of first to L-th blocks, wherein the plurality of blocks include a first block and a second block to an L-th block provided that L is an integer of 3 or more, first to (L−1)th user data stored in the first block (e.g., block in Chip 0) to an (L−1)th block (e.g., block in Chip 2) and first parity data stored in an L-th block (e.g., block in CHIP 3) constitute a first RAID (e.g., RAID 1), an operating method may include in response to a garbage collection operation being performed on the plurality of blocks, copying valid user data among the first to (L−1)th user data to normal regions of at least one first destination block; and newly calculating parity data corresponding to the copied valid user data. The garbage collection operation is not limited to this described embodiment, and garbage collection operations may be performed in variously different manners.

In the embodiment shown in FIG. 14, a case is illustrated in which valid data of two source blocks of each flash memory chip is copied to one destination block, but RAIDs may be constituted and parity data may be recalculated in various methods according to the number of word lines in a block of each chip and the number of flash memory chips storing data constituting RAIDs. For example, in the garbage collection operation, some valid data of the first to fourth flash memory chips Chip 0 to Chip 3 may be copied to other flash memory chips and constitute a new RAID. Also, as valid data stored in other flash memory chips are copied to the first to fourth flash memory chips Chip 0 to Chip 3, the valid data copied from the other flash memory chips may constitute a new RAID in the first to fourth flash memory chips Chip 0 to Chip 3.

Figure 15:
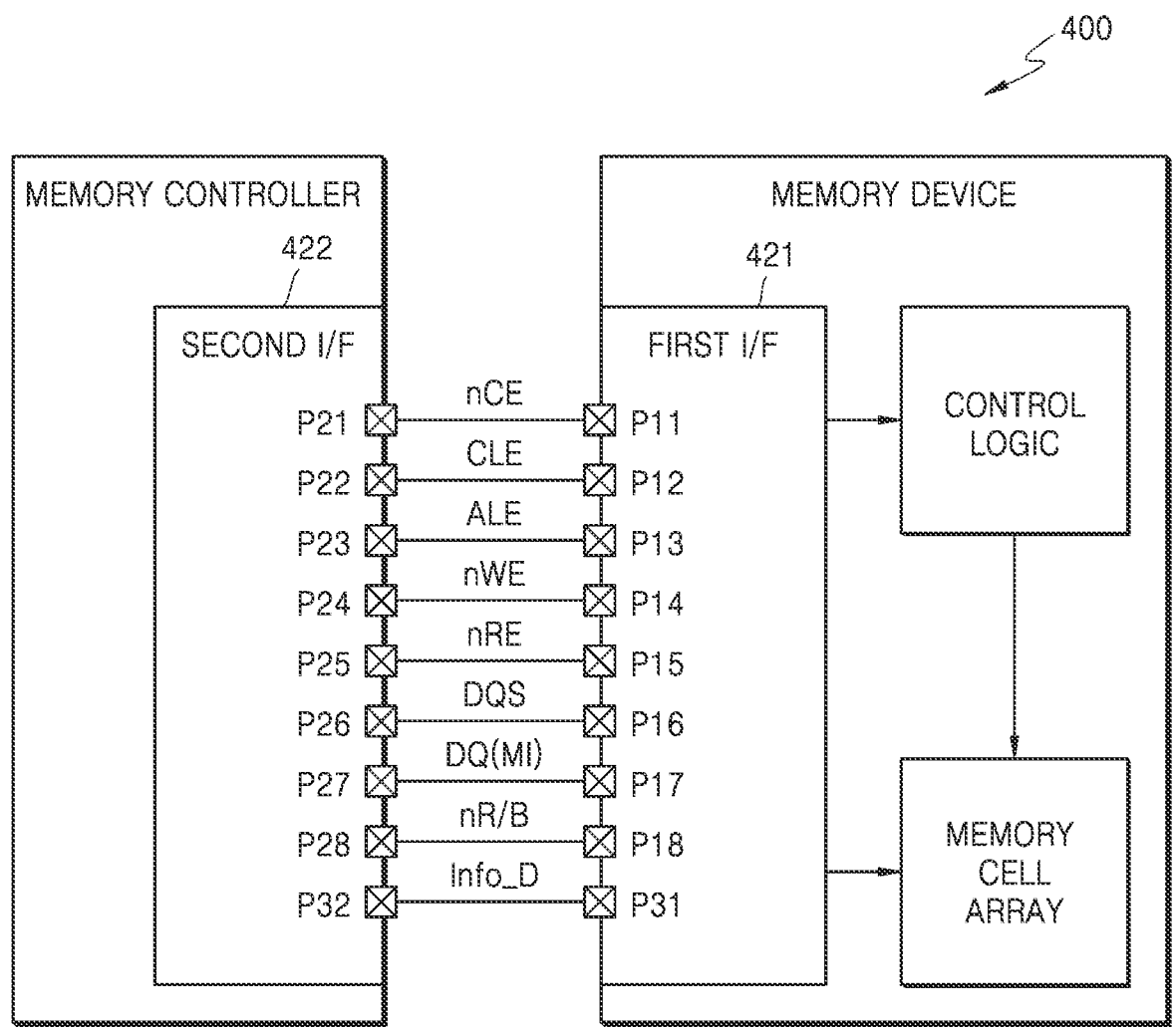
FIG. 15 illustrates a diagram of an example of interfaces of a memory controller and a memory device.

FIG. 15 illustrates a diagram of an example of interfaces of a memory controller and a memory device.

Referring to FIG. 15, a memory system 400 may include a memory device and a memory controller. The memory device may include a first interface circuit 421, and the memory controller may include a second interface circuit 422. The first interface circuit 421 may include a first pin P11 to an eighth pin P18, and the second interface circuit 422 may include a ninth pin P21 to a sixteenth pin P28. Also, at least one pin for transmitting/receiving at least one piece of information related to communication between the memory device and the memory controller based on side-band communication may be further arranged, and for example, a seventeenth pin P31 and an eighteenth pin P32 are illustrated.

Referring to FIG. 15, as a chip enable signal nCE is activated (e.g., at a low level), various signals may be transmitted/received between the first interface circuit 421 and the second interface circuit 422. As an example, a command may be provided to the first interface circuit 421 in an enable period (e.g., in a high level state) of a command latch enable signal CLE based on toggle timings of a write enable signal nWE. Also, an address may be provided to the first interface circuit 421 in an enable period (e.g., in a high level state) of an address latch enable signal ALE based on toggle timings of the write enable signal nWE. That is, the write enable signal nWE may be toggled in the periods in which the command and the address are transmitted. In addition, the first interface circuit 421 may receive a data strobe signal DQS and receive data DQ based thereon. In some embodiments, under control of a processor (e.g., processor 210 in FIG. 3), the second interface circuit 422 may output or provide a first address so that the plurality of pieces of user data are copied to a normal region of the plurality of blocks, and output or provide a second address so that the parity data is copied to a deterioration region of the plurality of blocks.

Moreover, in a read operation, the first interface circuit 421 may receive a toggled read enable signal nRE and generate a toggled data strobe signal DQS based on the toggling of the read enable signal nRE. Also, the first interface circuit 421 may transmit the data DQ to the second interface circuit 422 based on a toggle timing of the data strobe signal DQS. In addition, in program and read operations, a ready/busy output signal nR/B may be transmitted between the first interface circuit 421 and the second interface circuit 422, and when the memory device is in a busy state (i.e., when internal operations are being performed in the memory device), the first interface circuit 421 may transmit the ready/busy output signal nR/B indicating a busy state to the memory controller.

According to example embodiments of the inventive concepts, various types of information may be transmitted/received through the first interface circuit 421 and the second interface circuit 422. As an example, various types of information according to embodiments of the inventive concepts may be transmitted/received through in-band communication and/or side-band communication. FIG. 15 illustrates a case in which deterioration information Info_D is provided to the second interface circuit 422 through side-band communication, and mapping information MI between data constituting a RAID is transmitted to the first interface circuit 421 through pins for transmitting the data DQ based on in-band communication, but the embodiments of the inventive concepts are not necessarily limited thereto, and information may be transmitted/received through various methods.

According to the embodiments described above, when the memory system 400 is initially driven, deterioration information Info_D is provided to the memory controller from the memory device, and accordingly, the memory controller may determine a deterioration region of a block included in the memory device, may perform a control operation for calculating (e.g., determining) a copy location for each type of data during a background operation accompanying a data copy operation, and may update mapping information according to a copy result and provide the same to the memory device.

Figure 16:
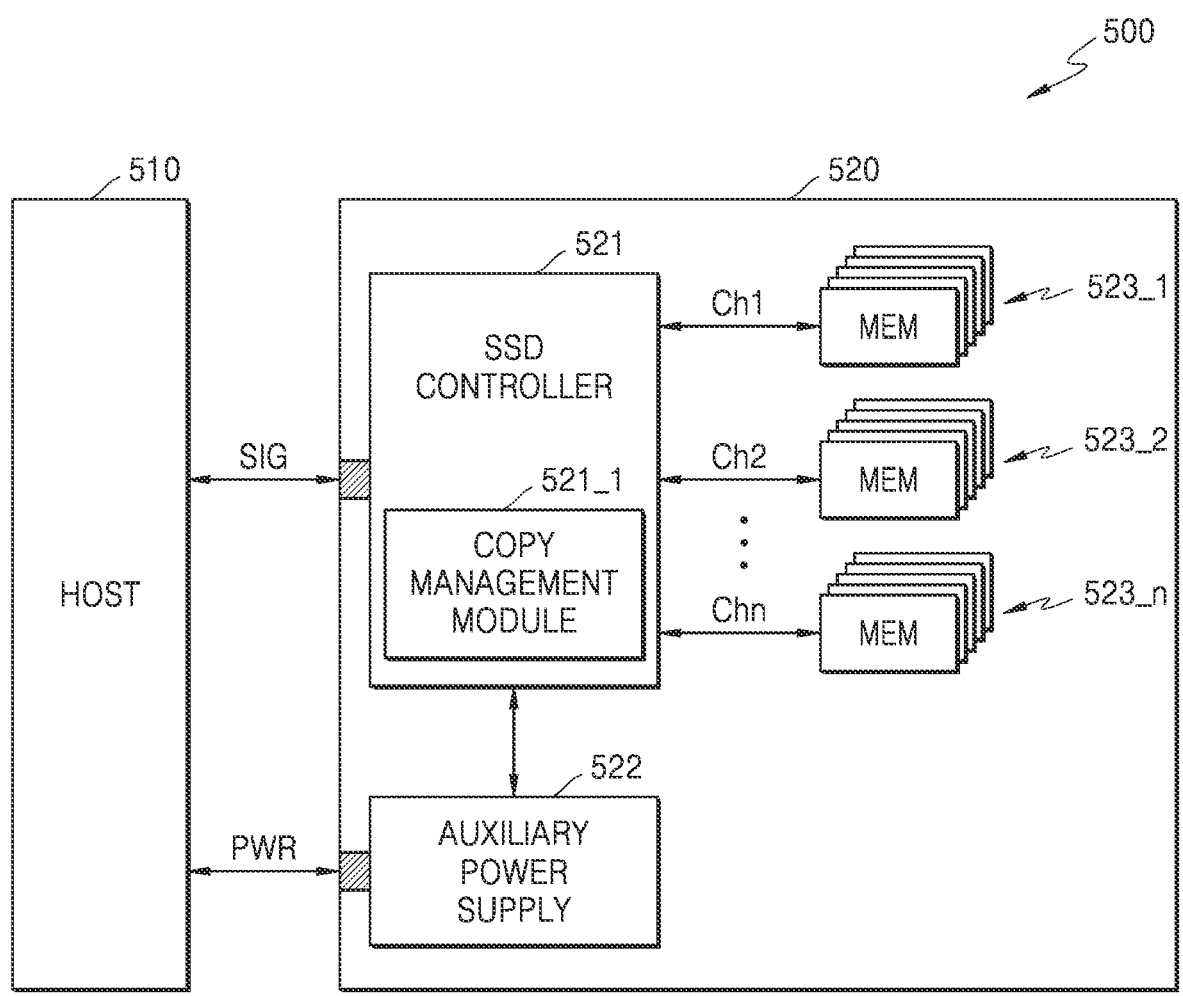
FIG. 16 illustrates a block diagram of an example in which a memory system is applied to a solid state drive (SSD) system, according to embodiments of the inventive concepts.

FIG. 16 illustrates a block diagram of an example in which a memory system is applied to a solid state drive (SSD) system 500, according to embodiments of the inventive concepts.

Referring to FIG. 16, the SSD system 500 may include a host 510 and an SSD 520. The SSD 520 may transmit and receive signals SIG to and from the host 510 through a signal connector and may receive power PWR through a power connector. The SSD 520 may include an SSD controller 521, an auxiliary power supply 522, and nonvolatile memory devices 523_1 to 523_n. The nonvolatile memory devices 523_1 to 523_n may each include NAND flash memory. In this case, the SSD 520 may be implemented by using the embodiments described above with reference to FIGS. 1 to 15.

For example, the SSD controller 521 included in the SSD 520 may include a copy management module 521_1 according to the embodiments described above and may receive, from the nonvolatile memory devices 523_1 to 523_n, deterioration information including information regarding one or more word lines that are relatively sensitive to read disturbance in each block. Also, the SSD controller 521 may control a reclaim operation and a garbage collection operation as a background operation for the nonvolatile memory devices 523_1 to 523_n, and when the background operation described above is performed, the aforementioned embodiments of the inventive concepts may be applied.

While the inventive concepts have been particularly shown and described with reference to embodiments thereof, it should be understood that various changes in form and detail may be made therein without departing from the spirit and scope of the following claims.

What is claimed is:

1. An operating method of a memory controller for controlling a memory device comprising a plurality of blocks, the operating method comprising:
    copying user data stored in a first block from among the plurality of blocks of a redundant array of inexpensive disks (RAID) to a normal region other than a deterioration region of another block from among the plurality of blocks, based on deterioration information indicating a location of the deterioration region in the plurality of blocks;
    copying parity data of the RAID among the data stored in the first block to the deterioration region of the another block; and
    updating mapping information between data constituting the RAID and transmitting the mapping information to the memory device,
    wherein the deterioration information comprises information regarding one or more word lines at specific locations included in the deterioration region in the plurality of blocks.

2. The operating method of claim 1, further comprising receiving the deterioration information read from a nonvolatile memory of the memory device.

3. The operating method of claim 1, wherein the plurality of blocks each have a three-dimensional memory structure, and the deterioration information comprises information regarding the one or more word lines being adjacent to a substrate in the plurality of blocks.

4. The operating method of claim 1, wherein the deterioration information comprises information regarding the one or more word lines in which a number of memory cells having a strong error is determined to exceed a preset reference value through a test process for each of the plurality of blocks.

5. The operating method of claim 1, wherein the plurality of blocks comprise the first block and a second block to an L-th block, wherein L is an integer of 3 or more, and
    first to (L−1)th user data stored in the first block to an (L−1)th block and first parity data stored in the L-th block constitute a first RAID, and
    the operating method further comprises:
    in response to a reclaim operation being performed on the first block, copying the first user data to a normal region of an (L+1)th block; and
    in response to a reclaim operation being performed on the L-th block, copying the first parity data to a deterioration region of an (L+2)th block.

6. The operating method of claim 5, wherein the first to L-th blocks are included in different flash memory chips, and
    the (L+1)th block is provided in a flash memory chip different from a flash memory chip including the first block, and the (L+2)th block is provided in a flash memory chip different from a flash memory chip including the L-th block.

7. The operating method of claim 5, wherein the first to (L−1)th user data comprises valid data and invalid data.

8. The operating method of claim 1, wherein the deterioration information is transmitted to the memory controller through in-band communication or side-band communication.

9. The operating method of claim 1, wherein the memory controller comprises:
    a processor; and
    a flash translation layer (FTL),
    wherein the FTL comprises a copy management module that determines a copy address based on the deterioration information, so that the parity data is copied to a word line of the deterioration region of the another block.

10. The operating method of claim 1, wherein the plurality of blocks comprise the first block and a second block to an L-th block, wherein L is an integer of 3 or more, and
    first to (L−1)th user data stored in the first block to an (L−1)th block and first parity data stored in the L-th block constitute a first RAID, and
    the operating method further comprises:
    in response to a garbage collection operation being performed on the plurality of blocks, copying valid user data among the first to (L−1)th user data to normal regions of at least one first destination block; and
    newly determining parity data corresponding to the copied valid user data.

11. The operating method of claim 10, further comprising copying the newly determined parity data to a deterioration region of a second destination block,
    wherein the copied valid user data and the newly determined parity data constitute a new RAID.

12. A memory controller for controlling a memory device comprising a plurality of blocks, the memory controller comprising:
    a processor;
    a working memory storing a flash translation layer (FTL) executed by the processor; and
    a memory interface configured to communicate with the memory device,
    wherein during a background operation of the memory device with respect to a plurality of pieces of user data and parity data corresponding to the plurality of pieces of user data, the plurality of pieces of user data and the parity data being stored in the memory device and constituting a redundant array of inexpensive disks (RAID), the memory interface is configured responsive to the processor to output a first address so that the plurality of pieces of user data are copied to a normal region of the plurality of blocks, and output a second address so that the parity data is copied to a deterioration region of the plurality of blocks.

13. The memory controller of claim 12, wherein the memory interface is configured to receive deterioration information from the memory device, and
the deterioration information comprises information regarding one or more word lines at specific locations included in the deterioration region in the plurality of blocks.

14. The memory controller of claim 13, wherein the plurality of blocks each have a three-dimensional memory structure, and the deterioration information comprises information regarding one or more word lines adjacent to a substrate in the plurality of blocks.

15. The memory controller of claim 12, further comprising a copy management module loaded into the working memory,
wherein in response to the processor executing the copy management module, the second address is generated so that the parity data is copied to the deterioration region of the plurality of blocks.

16. The memory controller of claim 12, wherein in response to the plurality of pieces of user data and the parity data constituting the RAID being copied, the memory interface is configured to transmit to the memory device updated mapping information between the plurality of pieces of user data and the parity data.

17. The memory controller of claim 12, wherein the background operation comprises a reclaim operation and a garbage collection operation,
wherein in the reclaim operation both valid data and invalid data included in the plurality of pieces of user data are copied, and
in the garbage collection operation, among the valid data and the invalid data included in the plurality of pieces of user data, the valid data is selectively copied.

18. A memory system comprising a memory device, wherein the memory device comprises:
a memory cell array comprising a plurality of blocks;
a control logic circuit configured to control operations of writing and reading data to and from the memory cell array; and
an interface circuit configured to transmit and receive various signals to and from a memory controller,
wherein the interface circuit is configured to output to the memory controller deterioration information comprising information regarding one or more word lines at specific locations included in a deterioration region of the plurality of blocks,
a plurality of pieces of user data and parity data corresponding to the plurality of pieces of user data are stored in the memory device and constitute a redundant array of inexpensive disks (RAID), and
the control logic circuit is configured to copy the plurality of pieces of user data to a normal region of the plurality of blocks, and copy the parity data to the deterioration region of the plurality of blocks based on the various signals from the memory controller.

19. The memory system of claim 18, wherein the memory controller is provided in the memory system, and comprises a copy management module configured to generate based on the deterioration information a first address so that the plurality of pieces of user data are copied to the normal region, and generate a second address so that the parity data is copied to the deterioration region.

20. The memory system of claim 18, wherein the interface circuit is configured to receive updated mapping information from the memory controller between the plurality of pieces of user data and the parity data in response to the plurality of pieces of user data and the parity data constituting the RAID and being copied.

\* \* \* \* \*